(12) United States Patent
Bretthauer et al.

(10) Patent No.: US 10,715,926 B2
(45) Date of Patent: Jul. 14, 2020

(54) MEMS COMPONENT AND MOBILE DEVICE COMPRISING THE MEMS COMPONENT

(71) Applicant: Infineon Technologies AG, Neubiberg (DE)

(72) Inventors: Christian Bretthauer, Munich (DE); Pedro Augusto Borrego Lambin Torres Amaral, Villach (AT); Christoph Glacer, Munich (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 16/195,194

(22) Filed: Nov. 19, 2018

(65) Prior Publication Data

US 2019/0208330 A1 Jul. 4, 2019

(30) Foreign Application Priority Data

Dec. 29, 2017 (DE) .................. 10 2017 223 869

(51) Int. Cl.
*H04R 19/04* (2006.01)
*B81B 3/00* (2006.01)
(Continued)

(52) U.S. Cl.
CPC .......... *H04R 19/04* (2013.01); *B81B 3/0021* (2013.01); *H04R 3/00* (2013.01); *H04R 19/005* (2013.01); *B81B 2201/0257* (2013.01); *B81B 2201/0271* (2013.01); *B81B 2203/0127* (2013.01); *B81B 2203/04* (2013.01); *B81B 2207/03* (2013.01);
(Continued)

(58) Field of Classification Search
CPC ........ H04R 19/04; H04R 19/005; H04R 3/00; H04R 17/025; H04R 2499/11; B81B 3/0021; B81B 2201/0257; B81B 2201/0271; B81B 2201/003; B81B 2203/0127; B81B 2203/04;
(Continued)

(56) References Cited

U.S. PATENT DOCUMENTS 5,146,435 A * 9/1992 Bernstein ............... G01H 11/06
29/25.42
5,531,118 A 7/1996 Knoll et al.
(Continued)

FOREIGN PATENT DOCUMENTS

DE 4338743 A1 5/1995
DE 10053081 A1 5/2002
(Continued)

*Primary Examiner* — Fan S Tsang
*Assistant Examiner* — Angelica M McKinney
(74) *Attorney, Agent, or Firm* — Slater Matsil, LLP

(57) ABSTRACT

A MEMS component includes a MEMS sound transducer having a membrane structure and an assigned counterelectrode structure, and a circuit unit, which is electrically coupled to the MEMS sound transducer and which in a first operating mode of the MEMS sound transducer in the audio frequency range detects an audio output signal of the MEMS sound transducer on the basis of a deflection of the membrane structure relative to the counterelectrode structure, the deflection being brought about by an acoustic sound pressure change, and in a second operating mode of the MEMS sound transducer in the ultrasonic frequency range to drive and read the MEMS sound transducer as an ultrasonic transceiver.

24 Claims, 9 Drawing Sheets

(51) Int. Cl.
*H04R 3/00* (2006.01)
*H04R 19/00* (2006.01)
*H04R 29/00* (2006.01)
*H04R 17/02* (2006.01)

(52) U.S. Cl.
CPC ............ *H04R 17/02* (2013.01); *H04R 29/004* (2013.01); *H04R 2201/003* (2013.01); *H04R 2499/11* (2013.01); *H04R 2499/15* (2013.01)

(58) Field of Classification Search
CPC ............ B81B 2203/05; B81B 2207/03; B81B 2207/053; H02K 99/00; H02N 1/00; H01L 41/00
See application file for complete search history.

(56) References Cited

U.S. PATENT DOCUMENTS

| | | | |
|---|---|---|---|
| 8,401,513 | B2 | 3/2013 | Langereis et al. |
| 2008/0252595 | A1 | 10/2008 | Boillot |
| 2009/0268553 | A1* | 10/2009 | Ecker ...................... G01S 7/003 367/119 |
| 2013/0062710 | A1* | 3/2013 | Dehe ...................... G01L 9/0016 257/415 |
| 2014/0266263 | A1* | 9/2014 | Wurzinger ......... G01R 27/2605 324/686 |
| 2015/0001647 | A1 | 1/2015 | Dehe et al. |
| 2016/0097855 | A1* | 4/2016 | Qutub ...................... B06B 1/02 367/99 |
| 2016/0097856 | A1* | 4/2016 | Qutub ...................... G01S 7/521 367/99 |
| 2018/0367921 | A1* | 12/2018 | Murarka ................. H04R 19/02 |
| 2019/0301956 | A1* | 10/2019 | Tanaka ..................... H04R 7/04 |

FOREIGN PATENT DOCUMENTS

| | | |
|---|---|---|
| DE | 102007046464 A1 | 3/2008 |
| DE | 102008031320 A1 | 1/2010 |
| DE | 102014109908 A1 | 1/2015 |
| DE | 102014212340 A1 | 1/2015 |
| WO | 2016054370 A1 | 4/2016 |

* cited by examiner

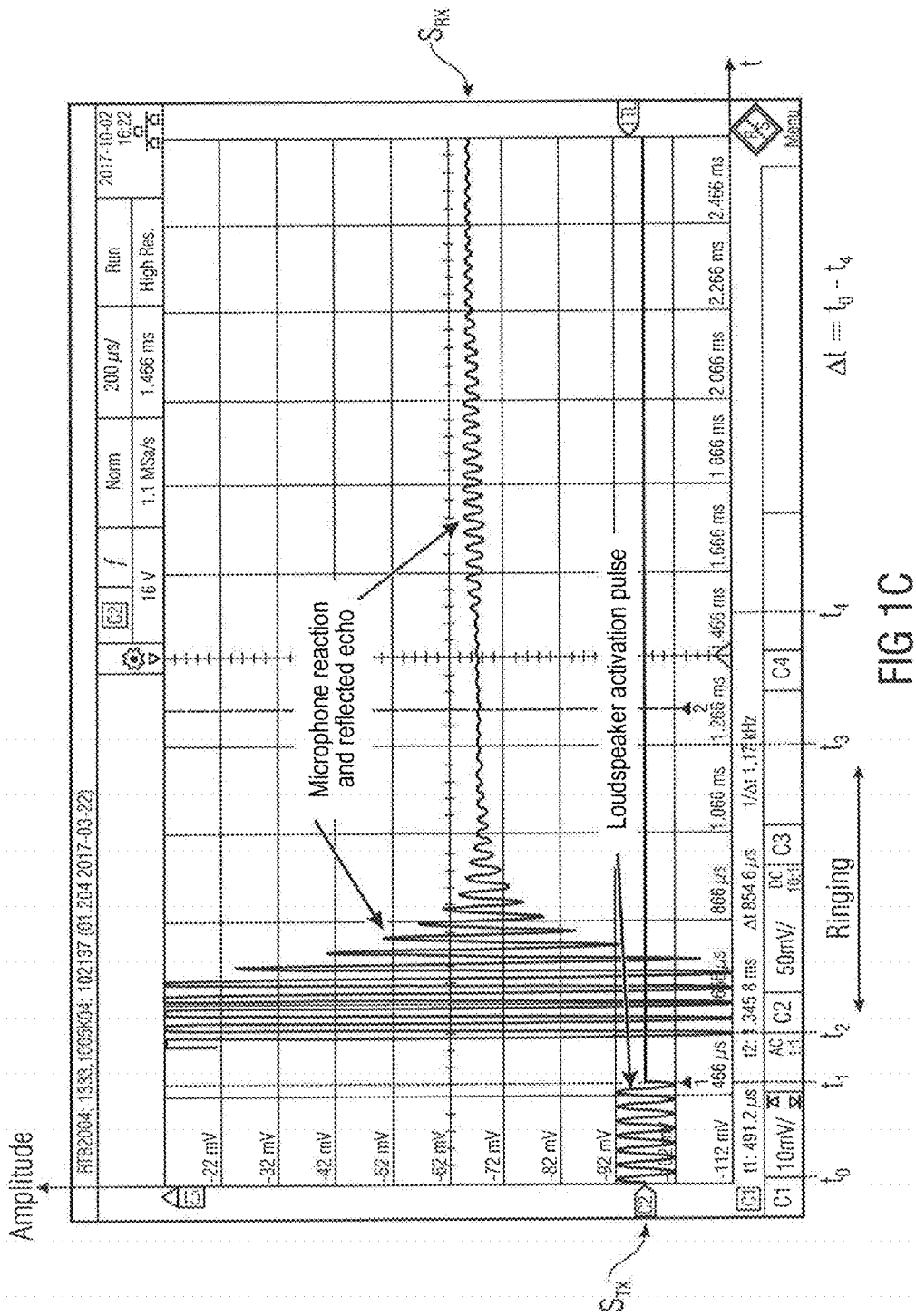

MEMS COMPONENT AND MOBILE DEVICE COMPRISING THE MEMS COMPONENT

This application claims the benefit of German Patent Application No. 102017223869.0, filed on Dec. 29, 2017, which application is hereby incorporated herein by reference.

TECHNICAL FIELD

Exemplary embodiments relate to an acoustic MEMS component comprising a membrane-based MEMS sound transducer, which is read in the audio range as an audio microphone and is also drivable and readable in the ultrasonic frequency range as an ultrasonic transceiver. Exemplary embodiments furthermore relate to an apparatus using the MEMS component as distance and/or temperature sensor. Exemplary embodiments furthermore relate to a mobile electronic device, such as e.g. a smartphone, notebook, tablet, etc., having a plurality of MEMS components which are readable in the audio frequency range as audio microphone and are also drivable and readable in the ultrasonic frequency range as ultrasonic transceiver, in order for example to detect ambient conditions, such as e.g. temperature, wind velocity, wind direction, etc., in the ambient atmosphere of the mobile device.

BACKGROUND

In the field of sensors there is a constant need for sensor elements which detect the desired measurement variables, such as e.g. various ambient conditions of a mobile device, with a sufficiently high accuracy.

Such a need can be met by the subject matter of the present independent patent claims. Developments of the present concept are defined in dependent claims.

SUMMARY

In accordance with one exemplary embodiment, a MEMS component 100 comprises a MEMS sound transducer 110 having a membrane structure 114 and an assigned counterelectrode structure 112, and a circuit unit 120, which is electrically coupled to the MEMS sound transducer 110 and which is furthermore configured in a first operating mode of the MEMS sound transducer 110 in the audio frequency range to detect an audio output signal of the MEMS sound transducer 110 on the basis of a deflection of the membrane structure 114 relative to the counterelectrode structure 112, said deflection being brought about by an acoustic sound pressure change $\Delta P$, and in a second operating mode of the MEMS sound transducer 110 in the ultrasonic frequency range furthermore to drive and read the MEMS sound transducer 110 as an ultrasonic transceiver.

Exemplary embodiments thus relate to the deployment or the use of a membrane-based MEMS sound transducer (MEMS=microelectromechanical system) or MEMS microphone as audio microphone in the audio frequency range, e.g. in a frequency range of between 10 Hz and 20 kHz, and as an ultrasonic transceiver (transceiver=transmitter–receiver) in the ultrasonic frequency range, e.g. in a frequency range of between 20 kHz and 300 kHz. In accordance with exemplary embodiments, therefore, a MEMS microphone is used both as an audio microphone and as an ultrasonic transceiver in order to provide a so-called combination sensor (also: combo-sensor) having a plurality of sensor functionalities.

During the ultrasonic operating state of the MEMS sound transducer, the membrane structure and/or the counterelectrode structure are/is excited electrostatically (capacitively) or piezoelectrically in order to generate sufficiently strong sound pressure levels at ultrasonic frequencies above the audio frequency range. In this case, by way of example, a resonance property of the membrane structure and/or of the counterelectrode structure of the MEMS sound transducer can be utilized in order to be able effectively to drive the counterelectrode structure or the membrane structure of the MEMS sound transducer with the ultrasonic transmission signal in the ultrasonic transmission operating state and to read it in the ultrasonic reception operating state.

The propagation time or time duration between a transmission instant of the ultrasonic transmission signal and the reception instant of the assigned ultrasonic reception signal can then be evaluated with regard to an ambient condition present in the ambient atmosphere, e.g. the ambient temperature or a movement velocity of the surrounding fluid, e.g. the wind velocity of the ambient air. With the use of a plurality of MEMS components or a plurality of pairs of MEMS components, the respective signal propagation times can then furthermore be evaluated with regard to a movement direction of the surrounding fluid, i.e. the wind direction of the ambient air.

Given a known or predefined value for the distance covered by the ultrasonic transmission signal through the ambient atmosphere, the temperature in the ambient atmosphere, e.g. the ambient air, can be determined for example from the resulting propagation time. By contrast, if the ambient temperature is known, the distance to an object that reflects the ultrasonic signal, the relative movement velocity (wind strength) of the ambient atmosphere and, given a plurality of sensors, additionally also the movement direction (wind direction) of the ambient air can also be determined from the propagation time of the ultrasonic transmission signal.

Consequently, in accordance with the present concept with a membrane-based MEMS component it is possible to detect a plurality of ambient parameters or ambient conditions as measurement variable with a high accuracy.

The present concept thus makes it possible for capacitive or piezoelectric MEMS microphones to be used in the audio frequency range as audio microphones, on the one hand, and in the ultrasonic frequency range as ultrasonic transceivers, on the other hand. A triple utilization of a single MEMS sound transducer can thus be achieved. On account of the very small size of this "combination sensor", in particular use in "handy" mobile devices which use MEMS sound transducers as audio microphones anyway is therefore possible and attractive.

This ultrasonic functionality of the MEMS microphones enables use for a multiplicity of applications, such as e.g. in gesture recognition, distance measurement, e.g. for a parking assistant, for rotational speed detection for a wheel or a shaft, for presence detection and/or monitoring, for monitoring the structural integrity of components, etc., to enumerate by way of example just some of the possible applications. In this context it is pointed out that in particular also on account of their lower power consumption vis-à-vis optical solutions, ultrasonic sensors can be used efficiently and comprehensively for the application examples indicated above.

MEMS components in accordance with the exemplary embodiments described which have a functionality both as audio microphone and as ultrasonic transceiver are distinguished by a small area requirement or a small installation volume, wherein no additional area or volume requirement arises in all applications that use MEMS microphones anyway. Furthermore, a system set-up can be greatly simplified since no separation between loudspeaker (transmitter) and receiver is necessary in the case of the MEMS components in accordance with the present exemplary embodiments.

By using a membrane-based MEMS sound transducer as an ultrasonic transceiver in the ultrasonic frequency range, it is possible to achieve a very good impedance matching between the emission element of the MEMS microphone and the surrounding medium, i.e. the process of releasing or emitting ultrasonic energy into the ambient medium, such as e.g. air, and also the process of picking up or receiving ultrasonic energy from the ambient medium can be carried out with a relatively high efficiency. This applies in particular if a capacitive MEMS microphone having a counterelectrode structure and back volume in a housing is used both as audio microphone and as ultrasonic transceiver.

Mobile devices, such as e.g. cellular phones, smartphones, notebooks, laptops, tablets, smart watches, etc., can thus be provided with an additional functionality or a sensor property, without this necessitating an additional space requirement in comparison with standard MEMS components, wherein well-established technologies that are proven with regard to their robustness can be used for the MEMS components or for the MEMS microphones. Furthermore, as a result of arranging a plurality of MEMS components in accordance with the present concept, beam shaping properties both in the audio operating state and in the ultrasonic operating state can increase the respective measurement and detection accuracy. The arrangement of said MEMS components in an array enables said beam shaping properties to be improved even further.

In accordance with exemplary embodiments, the present MEMS components with the membrane-based MEMS microphones, through the use as ultrasonic transceivers, can detect or measure the ambient temperature by virtue of a known reference path length for the ultrasonic signal and the temperature dependence of the velocity of sound in the fluid, e.g. in the ambient air, being predefined. A known path distance for the ultrasonic signal can be assumed, for example, if a reflection takes place at an object arranged at a predefined distance from the ultrasonic transceiver and the propagation time is determined proceeding from the transmission instant until the arrival of the reflected ultrasonic transmission signal. Alternatively, it is possible to detect the propagation time between two ultrasonic transceivers arranged at a fixed distance with respect to one another.

In this case, the present concept utilizes the known temperature dependence of the velocity of sound in a gas, e.g. in air. A predefined path distance for the ultrasonic signal is required for this purpose. This can be achieved, for example, by two MEMS components in accordance with exemplary embodiments being arranged at a predefined, fixed distance with respect to one another at the mobile device, or by an additional device being used, which can measure the propagation distance of the ultrasonic signal with high accuracy and ideally independently of the fluid temperature (air temperature), such as e.g. by means of an optical measurement or an RF measurement. For this purpose, in the mobile device, for example, it is also possible to use additional optical sensors or RF sensors for distance or propagation path measurement for the ultrasonic signal.

This reference distance or this reference path length for the ultrasonic signal is then used by the propagation time of the ultrasonic signal being detected and compared with the reference distance, wherein the fluid or air temperature can be extracted by a comparison of the measurement result with the known reference distance. If two or more fixed ultrasonic transceivers are used at the mobile device, the transmitting-receiving direction of said ultrasonic transceivers can be switched or changed. In this regard, the effect of a moving fluid, e.g. of moving air, on the propagation time difference in the two opposite transmitting-receiving directions can be taken into account in the temperature determination, wherein the fluid velocity, e.g. wind velocity, at the mobile device can furthermore be determined as a further measurement result.

Exemplary embodiments of the present MEMS components thus enable a measurement of the actual ambient temperature, wherein the measurement is not adversely influenced or impaired by a possible increased temperature within the mobile device, attributable for example to a power loss of the processor chips used in the mobile device.

Therefore, since this involves detecting the temperature of the surroundings outside the mobile device, it is possible to avoid a previous problem where the mobile device, e.g. the smartphone, must first reach an equilibrium temperature with the surroundings in order to be able to obtain a sufficiently exact measurement of the ambient temperature.

BRIEF DESCRIPTION OF THE DRAWINGS

Exemplary embodiments of apparatuses and/or methods are described in greater detail below by way of example with reference to the accompanying figures and drawings, in which:

FIG. 1c shows an exemplary temporal illustration of a signal profile of an ultrasonic transmission signal and a temporally offset signal profile of an ultrasonic reception signal of a MEMS component in accordance with one exemplary embodiment;

DETAILED DESCRIPTION OF ILLUSTRATIVE EMBODIMENTS

Before exemplary embodiments are explained more specifically in detail below with reference to the figures, it is pointed out that identical, functionally identical or identically acting elements, objects, function blocks and/or method steps are provided with the same reference signs in the different figures, such that the description of said elements, objects, function blocks and/or method steps as presented in the different exemplary embodiments is mutually interchangeable or can be applied to one another.

Various exemplary embodiments will now be described more thoroughly with reference to the accompanying figures, in which some exemplary embodiments are illustrated. In the figures, the thicknesses of lines, layers and/or regions may be illustrated in a manner not to scale, for clarification purposes.

Figure 1A:
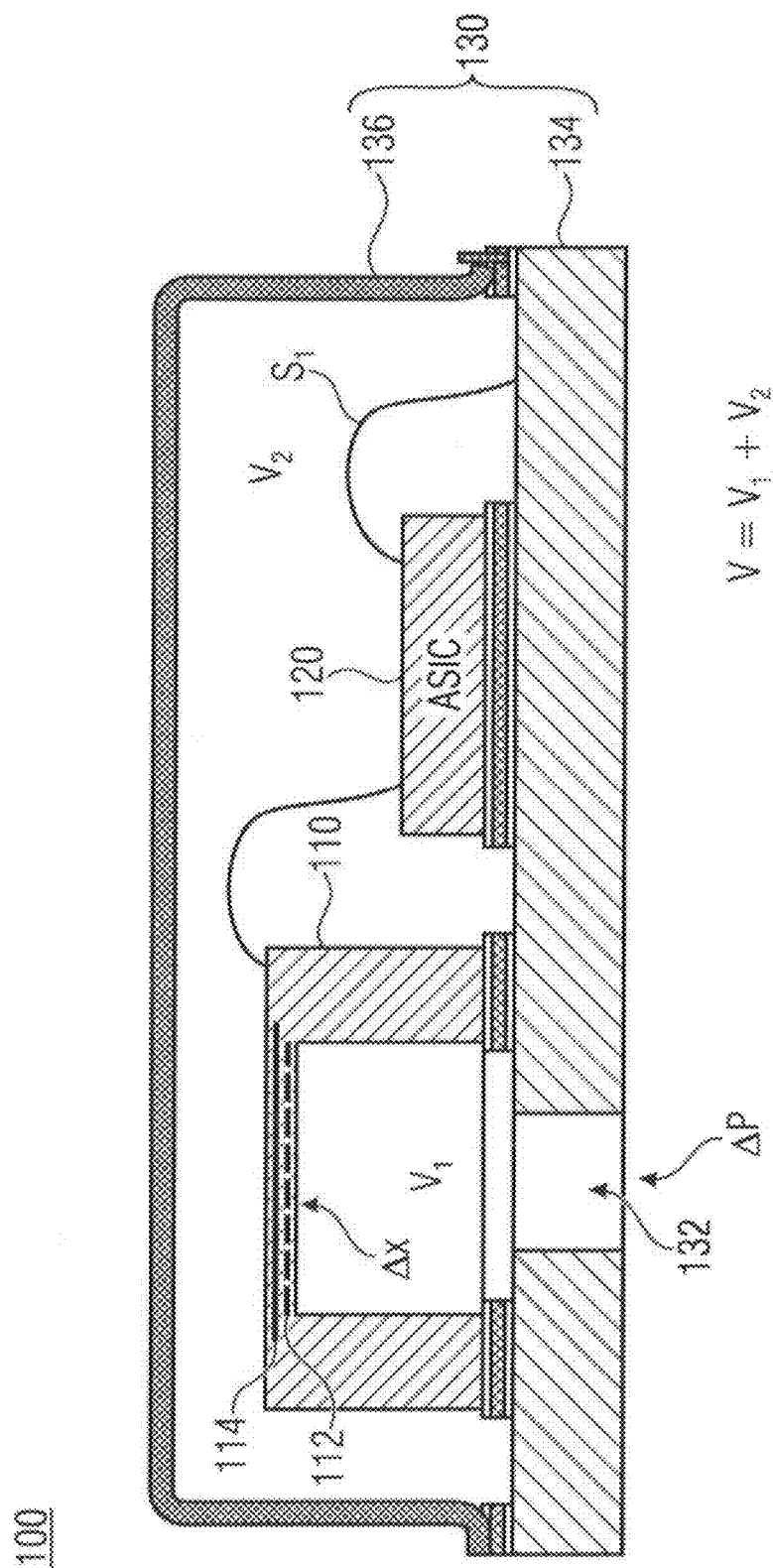
FIG. 1a shows a basic illustration in a cross-sectional view of a MEMS component having a membrane-based MEMS sound transducer or MEMS microphone and a circuit device electrically coupled thereto in accordance with one exemplary embodiment.

Hereinafter, a MEMS component 100 or an acoustic MEMS component having a membrane-based sound transducer or MEMS sound transducer 110 and a circuit device 120 electrically coupled thereto will now be described with reference to FIG. 1a in the form of a basic illustration in a cross-sectional view. As is illustrated in FIG. 1a, the MEMS microphone 110 can be arranged in a housing 130 having an interior volume V, wherein the housing 130 has an access or sound opening 132 to the interior volume V. The MEMS microphone 110 is arranged in the housing 130 for example adjacent to the sound opening 132. The housing 130 can then comprise for example a substrate 134 and a covering element 136, which can be configured as electrically conductive at least regionally. In one exemplary arrangement, the MEMS microphone 110 can subdivide the interior volume V into a front volume $V_1$ and a back volume $V_2$, wherein the front volume $V_1$ is situated in the region between the sound opening 132 and the MEMS microphone 110, and wherein the back volume $V_2$ is situated on the opposite side of the MEMS microphone 110 with respect thereto in the interior volume of the housing.

In this context, reference is furthermore made to the exemplary illustration of different MEMS sound transducer arrangements 110 in FIGS. 2a-2d, which illustrate by way of example different embodiments of MEMS sound transducers or MEMS microphones 110. In this context, it is furthermore pointed out that this exemplary illustration of membrane-based MEMS sound transducers should be regarded merely as by way of example and not as exhaustive and the present concept is equally applicable to other MEMS sound transducers as well.

As is illustrated by way of example in FIG. 1a, the MEMS sound transducer 110 comprises a membrane structure 114 and an assigned counterelectrode structure 112. The term "structure" is intended to illustrate that the membrane and the counterelectrode, respectively, can comprise a single conductive layer or else a layer sequence or layer stack having a plurality of different layers, wherein at least one of the layers is configured as conductive.

The MEMS component 100 furthermore comprises the circuit device 120 electrically coupled to the MEMS sound transducer 110. The circuit device 120 can then be arranged in the housing 130 of the MEMS component 100, as shown in FIG. 1a, wherein in accordance with further exemplary embodiments further external circuit elements and/or processing devices (not shown in FIG. 1a) can also be part of the circuit device 120 or be electrically coupled thereto in order to provide the functionality of the circuit device 120 as described below.

The circuit device 120 is configured, then, in a first operating mode of the MEMS sound transducer 110 in an audio frequency range, e.g. between approximately 10 Hz and 20 kHz or between 20 Hz and 15 kHz, to detect capacitively or else piezoelectrically an audio output signal of the MEMS sound transducer on the basis of a deflection of the membrane structure 114 relative to the counterelectrode structure 112, said deflection being brought about by an acoustic sound pressure change ΔP, i.e. to convert the mechanical deflection Δx into an electrical audio output signal $S_1$. The circuit device 120 is furthermore configured, then, in a second operating mode of the MEMS sound transducer 110 furthermore in the ultrasonic frequency range, i.e. for example between 20 kHz and 300 kHz, between 20 and 150 kHz, between 20 and 120 kHz or between 50 and 150 kHz, to read the MEMS microphone 110 as ultrasonic transceiver, i.e. to detect capacitively or else piezoelectrically an ultrasonic output signal $S_2$ of the MEMS sound transducer 110 on the basis of a mechanical deflection Δx between the membrane structure 114 and the counterelectrode structure 112, said deflection being brought about by an incident ultrasonic signal, i.e. to convert the mechanical deflection Δx into an electrical output signal S1.

The second operating mode, i.e. the ultrasonic transmission-reception mode, of the MEMS sound transducer 110 thus comprises an ultrasonic transmission operating state and an ultrasonic reception operating state, wherein the circuit device 120 is configured to drive the MEMS sound transducer 110, i.e. the counterelectrode structure or the membrane structure, in the ultrasonic transmission operating state as ultrasonic transmitting element, e.g. electrostatically (capacitively) or piezoelectrically, and to read the MEMS sound transducer 110 in the ultrasonic reception operating state as ultrasonic receiver, i.e. to detect an ultrasonic reception signal of the MEMS microphone 110.

The circuit device 120 can furthermore be configured, then, to drive and/or to read the MEMS sound transducer 110 in the second operating mode in an "ultrasonic resonance range" of the MEMS microphone. In this case, the ultrasonic resonance range of the MEMS microphone is based on an ultrasonic resonance property of the counterelectrode structure or of the membrane structure or of a combination of the counterelectrode structure and the membrane structure, wherein the configuration or shape and size of the back volume $V_2$ and/or of the front volume $V_1$ can also influence the resonance property in a targeted manner. Furthermore, by way of example, the shape, size and/or positioning of the sound opening (also called: sound port) at the housing of the sound transducer can also influence the resonance property of the sound transducer in a targeted manner. In this regard, it is possible to establish that the resonance property of the sound transducer can be influenced in a targeted manner for example predominantly by one of the above component parts (e.g. counterelectrode structure, membrane structure, front volume, back volume and/or sound opening) or else by a combination of at least two of these component parts. Since a membrane-based MEMS microphone can have different resonance ranges, a higher-order ultrasonic resonance range of the MEMS microphone 110 can also be used.

The set-up of the MEMS microphone 110 and also the configuration, i.e. the shape and the materials, of the housing 130, can influence the resonant frequency(-ies) fRES of the MEMS sound transducer or can be selected in a targeted manner for setting the resonant frequency(-ies) of the MEMS sound transducer. The MEMS sound transducer 110 arranged in the interior volume V of the housing 130 has for example an ultrasonic resonant frequency in a range of between 20 and 150 kHz or between 20 and 120 kHz.

Figure 1B:
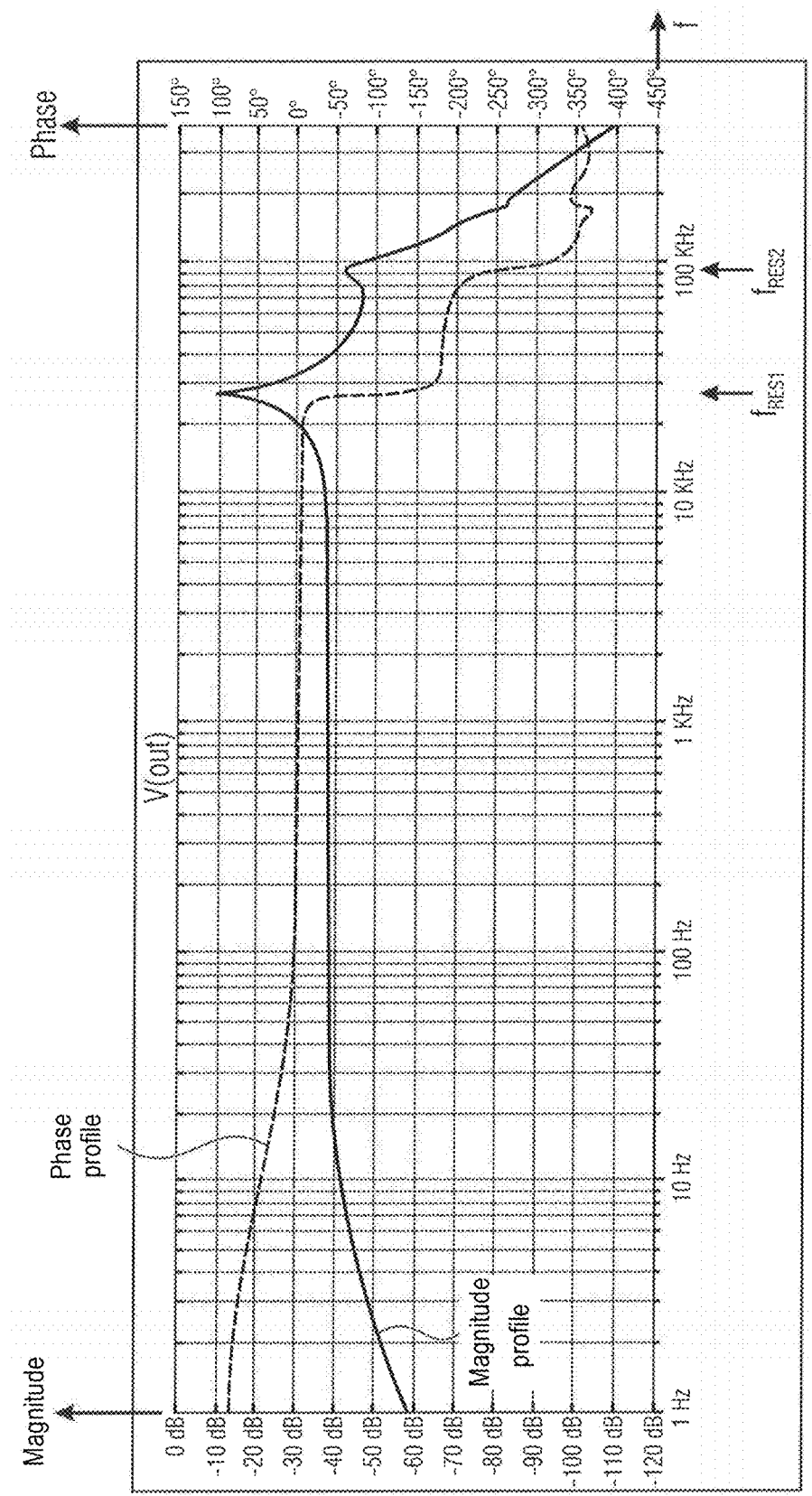
FIG. 1b shows an exemplary damping profile of a MEMS microphone in accordance with one exemplary embodiment.

FIG. 1b illustrates an exemplary magnitude and phase profile of a typical capacitive MEMS sound transducer or MEMS microphone 110 against frequency f, wherein (positive) resonances $f_{RES1}$, $f_{RES2}$ are evident at frequencies of approximately 27 kHz and 95 kHz.

FIG. 1c illustrates by way of example against time t a signal profile of an ultrasonic transmission signal $S_{TX}$ and a signal profile temporally offset with respect thereto of an ultrasonic reception signal $S_{RX}$ of a MEMS sound transducer 110 in accordance with one exemplary embodiment. As is shown in FIG. 1c, during the time duration $t_0$-$t_1$, an ultrasonic transmission signal $S_{TX}$ in the ultrasonic frequency range is applied to the MEMS sound transducer 110 or a corresponding ultrasonic transmission pulse is emitted by the MEMS sound transducer 110. This is referred to as loudspeaker activation pulse (speaker actuation pulse). In a subsequent time range $t_2$-$t_3$, a direct reaction of the MEMS sound transducer 110 to the ultrasonic transmission pulse $S_{TX}$ in the form of a strong oscillating excitation of the MEMS sound transducer 110 occurs, which is also referred to as "ringing". This "ringing" decays relatively rapidly exponentially until the instant $t_3$, such that at the instant $t_4$ (after the instant $t_3$) in FIG. 1c the ultrasonic reception signal $S_{RX}$ of the MEMS sound transducer 110, i.e. the reflected echo signal $S_{RX}$, can be detected and read out.

The directly excited "ringing" of the MEMS sound transducer 110 on account of the ultrasonic transmission signal $S_{TX}$ (ultrasonic transmission pulse) predefines the minimum distance that can be detected by the MEMS sound transducer in ultrasonic transmission-reception operation, i.e. as soon as the undesired excitation of the MEMS sound transducer has decayed to a sufficiently great extent, the echo signal $S_{RX}$ can be reliably detected. The time duration $t_2$-$t_3$ for the "ringing" can lie e.g. in a range of 0.1 to 0.5 ms, such that the minimum propagation distance for the ultrasonic signal can be of the order of magnitude of a few centimeters, for example 3 to 15 cm, in order to be able to detect the reflected ultrasonic reception signal.

Some measures for suppressing or at least reducing "ringing" are explained by way of example below.

In accordance with one exemplary embodiment, after the ultrasonic transmission pulse has been emitted, the membrane structure 114 of the MEMS sound transducer 110 can be brought actively to a so-called pull-in state in order to obtain an active damping state of the membrane structure 114. For this purpose, by way of example, a pull-in signal, e.g. an electrostatic voltage or a DC voltage, can be applied between the membrane structure 114 and the counterelectrode structure 112 in order to obtain a mechanical biasing or damping state of the membrane structure.

Both an audio and an ultrasonic reception mode are possible in the pull-in state of the membrane structure 114. In this regard, the ultrasonic detection can take place virtually without restriction in the pull-in state, wherein an, albeit damped, audio detection is furthermore also possible in the pull-in state. The damping for the audio detection can be in a magnitude region of approximately 6 dB.

In the pull-in state, substantially the edges of the microphone structure 114 contribute to detecting the audio signal and the ultrasonic signal since, in the pull-in state, substantially the center region of the membrane bears against the counterelectrode structure (with the anti-sticking bumps), wherein so-called anti-sticking bumps (not shown in FIG. 1a) can be provided at the membrane structure and/or the counterelectrode structure for a punctiform mechanical contact of the membrane structure 114 and counterelectrode structure 112, in order to prevent same from mutually sticking to one another over a large area.

By means of the pull-in state of the membrane structure 114, a change in the resonant frequency and thus in the sensitivity of the sound transducer in the ultrasonic reception mode for the ultrasonic signal can be taken from a first resonance range around a first frequency into a second resonance range around a second, different frequency (e.g. a higher frequency at 110 kHz +/−10 kHz), such that the ultrasonic detection can take place with a high sensitivity (on account of the resonant frequency) in the frequency range set. Since the sensitivity of the sound transducer for the ultrasonic reception mode is altered to the second resonance range in a targeted manner in the pull-in state, sound transducers of the same type or adjacent sound transducers or sound transducers of other mobile devices in the vicinity are substantially not impaired by the ultrasonic transmission signal, provided that they are not currently in the pull-in state as well.

For the ultrasonic transmission mode, a change in the resonant frequency of the sound transducer between a non-activated pull-in state with the first resonance range and an activated pull-in state with the resulting second resonance range upon the emission of the ultrasonic transmission signal by the membrane structure 112 has no significant effect on the resulting ultrasonic transmission pulse.

Therefore, the ultrasonic transmission mode can take place in the non-activated pull-in state with the first resonance range, while the ultrasonic reception mode takes place in the activated pull-in state with the second resonance range, to which the sensitivity of the sound transducer for the ultrasonic reception mode is set in a targeted manner.

To summarize, the following effects resulting from actively setting a pull-in state can be indicated.

The "ringing" is substantially stopped or at least reduced on account of the active damping of the membrane structure.

Structurally identical sound transducer elements in the same mobile device or in mobile devices in the vicinity do not mutually disturb one another in the ultrasonic range.

Furthermore, performance fluctuations of the sound transducers 100 that arise for example on the basis of production process fluctuations or else aging processes can be compensated for or at least reduced by a targeted setting of the pull-in range, i.e. the pull-in voltage. By adapting or readjusting the pull-in voltage, it is possible for the resonant frequency of the sound transducer, said resonant frequency otherwise changing somewhat, to be set to a constant value. Furthermore, a plurality of sound transducers arranged e.g. in an array can be set to the same resonance range for the ultrasonic signal detection.

Furthermore, an ultrasonic detection channel setting with different pull-in voltages is possible, i.e. a channel setting is based on the targeted setting of different resonant frequencies of the sound transducer, such that different resonant frequencies (frequency hopping) of the sound transducer can be achieved by means of different pull-in voltages.

Different possible implementations of capacitive MEMS sound transducers or MEMS microphones 110 which can be used in the present MEMS component too will now be illustrated by way of example below with reference to FIGS. 2a-2d.

Figure 2A:
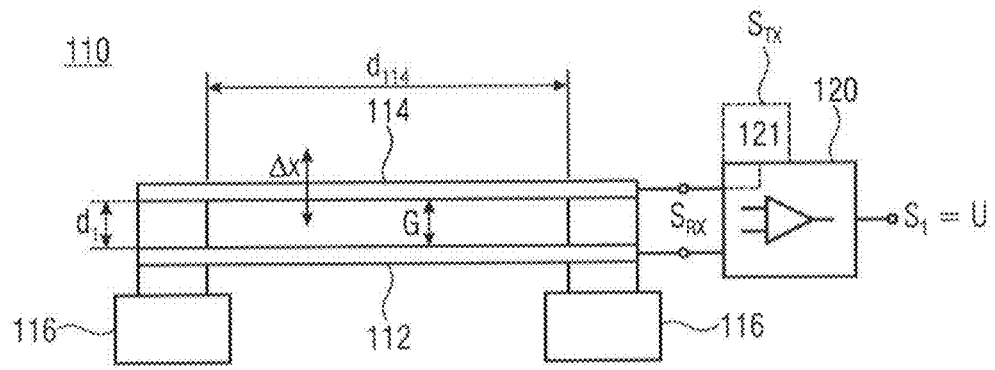
FIG. 2a shows a basic cross-sectional view of a membrane-based MEMS microphone having an exemplary read-out circuit in accordance with one exemplary embodiment.

FIG. 2a shows, then, a basic illustration of the MEMS sound transducer 110 having a membrane structure 114 and a counterelectrode structure 112. As is illustrated in FIG. 2a, the layer arrangement is arranged on a carrier substrate 118, with the membrane structure 114 and the counterelectrode structure 112 separated and spaced apart from one another. The counterelectrode structure 112, which is generally configured to be more rigid than the deflectable membrane structure 114, is spaced apart at a distance d' from the latter, with the result that a capacitance C can form between the counterelectrode structure 112 and the membrane structure 114 and can be detected by the circuit device 120. The non-clamped region $d_{114}$, e.g. $d_{114} \approx 0.3\text{-}1.5$ mm or 0.5-1 mm, of the membrane structure 114 is referred to as the deflectable or movable region of the membrane structure 114.

A deflection $\Delta x$ of the membrane structure 114 relative to the counterelectrode structure 112 can then be detected or read out by means of the processing device 120 in order to provide a corresponding output signal $S_1$, e.g. in the form of an output voltage U, of the MEMS sound transducer 110.

The circuit device 120 can then be configured for example to apply a constant charge to the MEMS microphone 110 effective as "plate capacitor", i.e. to the counterelectrode structure 112 or membrane structure 114. The equations below make it clear that a deflection of the membrane structure relative to the counterelectrode structure can then be converted proportionally into an output signal or an output voltage $S_1$=U:

Q=C·U where Q=const, where $$U = \frac{Q_0}{C}$$

and where $$C \sim \varepsilon \frac{A}{(d1 \pm \Delta x)},$$

it follows that

U≈d1+Δx

As is evident from the equation above, it is possible to obtain an output signal $S_1$ of the MEMS sound transducer 110 which is proportional to the distance $d_1$ or the change in distance $d_1 \pm x$ between the membrane structure 114 and the counterelectrode structure 112. The distance $d_1$ can be in a range of 0.5 to 5 μm, for example.

The circuit device 120 can furthermore comprise an ultrasonic signal source 121 in order to excite the membrane structure 114 or the counterelectrode structure 112 of the MEMS sound transducer 110 with an ultrasonic transmission signal $S_{TX}$. As is illustrated by way of example in FIG. 2a, the ultrasonic signal source 121 can excite the membrane structure 114 as ultrasonic transmitting element. Furthermore, the ultrasonic signal source 121 can be part of the circuit device 120. The ultrasonic signal source 121 can also be configured separately from the circuit device 120.

In accordance with one exemplary embodiment the circuit device 120 is thus configured in the ultrasonic transmission operating state of the second operating mode of the MEMS sound transducer 110 to apply an ultrasonic excitation signal (ultrasonic transmission signal) $S_{TX}$ to the membrane structure 114 or between the counterelectrode structure 112 and the membrane structure 114 for generating the ultrasonic transmission signal $S_{TX}$ and in the ultrasonic reception operating state of the second operating mode of the MEMS sound transducer 110 to read out an ultrasonic reception signal $S_{RX}$ of the MEMS sound transducer 110, which ultrasonic reception signal $_{SRX}$ is based on the reflected signal portion $S_{RX}$ of the emitted ultrasonic transmission signal $S_{TX}$ (or ultrasonic transmission pulse) and brings about a mechanical deflection between the membrane structure 114 and the counterelectrode structure 112.

In accordance with exemplary embodiments, therefore, generally the drive signal $S_{TX}$ is applied between membrane structure and counterelectrode structure of the sound transducer, while the sensor signal is likewise read out between membrane structure and counterelectrode structure of the MEMS sound transducer.

A basic illustration of a MEMS sound transducer or MEMS microphone 110 having a dual-counterelectrode configuration (dual-backplate configuration) will now be illustrated below with reference to FIG. 2b.

Figure 2B:
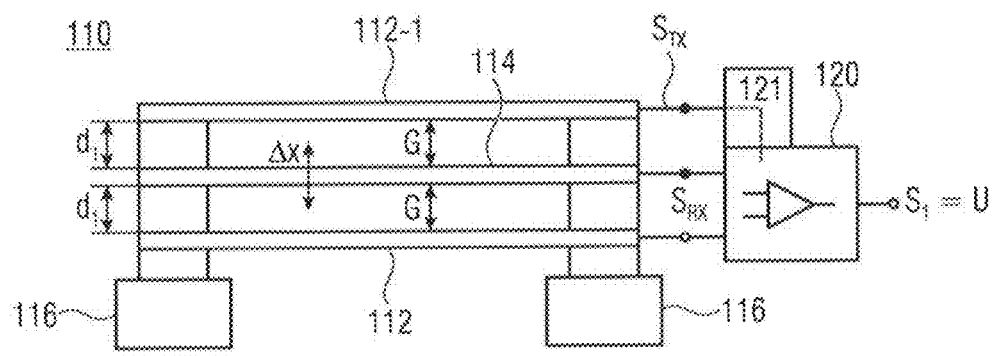
FIG. 2b shows a basic cross-sectional view of a membrane-based MEMS microphone in a dual-counterelectrode configuration (dual-backplate configuration) having an exemplary read-out circuit in accordance with one exemplary embodiment.

As is illustrated in the schematic lateral sectional view in FIG. 2b, the MEMS sound transducer 110 furthermore comprises a further counterelectrode structure 112-1, such that the membrane structure 114 is arranged between the first and second counterelectrode structures 112, 112-1. In the case of the dual-counterelectrode arrangement illustrated in FIG. 2b, the circuit device 120 can be configured to read the MEMS sound transducer in a "single-ended" (common-mode) or differential manner.

In the case of the configuration of the MEMS sound transducer 110 as illustrated in FIG. 2b, the circuit device 120 is furthermore configured, then, in the first operating state of the MEMS sound transducer 110 to detect the deflection $\Delta x$ of the membrane structure 114 relative to the counterelectrode structure 112 and/or relative to the further counterelectrode structure 112-1, said deflection being brought about by an acoustic sound pressure change, depending on whether the audio output signal $S_1$ of the MEMS sound transducer is detected in a "single-ended" (common-mode) or differential manner.

In the ultrasonic transmission operating state of the second operating mode of the MEMS sound transducer 110, the circuit device 120 sets e.g. a DC voltage operating point between the membrane structure 114 and the counterelectrode structure 112, wherein an ultrasonic excitation signal is applied to the further counterelectrode structure 112-1 for generating the ultrasonic transmission signal $S_{TX}$ or transmission pulse.

In accordance with a further exemplary embodiment, in the ultrasonic transmission operating state of the second operating mode of the MEMS sound transducer 110, an ultrasonic excitation signal can be applied between the circuit device 120 and the two counterelectrode structures 112, 112-1 for generating the ultrasonic transmission signal $S_{TX}$ or transmission pulse.

In the ultrasonic reception operating state of the second operating mode of the MEMS sound transducer 110, an ultrasonic reception signal $S_{RX}$ of the MEMS sound transducer 110 is read out by the circuit device 120, wherein the ultrasonic reception signal $S_{RX}$ is based on the reflected signal portion of the emitted ultrasonic transmission signal $S_{TX}$, which signal portion brings about a mechanical deflection of the membrane structure 114 relative to the counterelectrode structure 112 and/or the further counterelectrode structure 112-1.

In this case, the ultrasonic resonance range of the MEMS sound transducer 110 is based on an ultrasonic resonance property of the counterelectrode structure 112 or of the membrane structure 114 of the MEMS sound transducer.

A basic illustration in a sectional view of a MEMS sound transducer 110 in a dual-membrane MEMS configuration (sealed dual-membrane configuration) will now be illustrated below with reference to FIG. 2C.

Figure 2C:
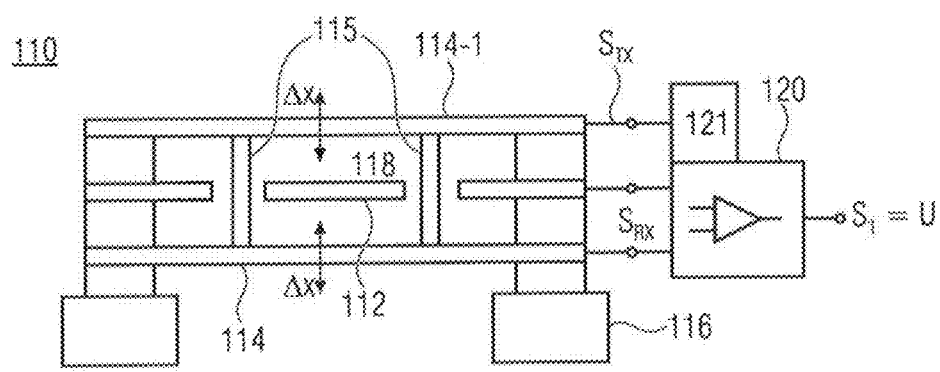
FIG. 2c shows a basic cross-sectional view of a membrane-based MEMS microphone in a dual-membrane configuration (sealed dual-membrane configuration) having an exemplary read-out circuit in accordance with one exemplary embodiment.

As is illustrated in FIG. 2c, the sound transducer 110 comprises the (first) membrane structure 114 and a further (second) membrane structure 114-1 spaced apart therefrom with the counterelectrode structure 112 arranged therebetween, said counterelectrode structure being spaced apart in each case from the first and second membrane structures 114, 114-1. Furthermore, at least one mechanical connection element 115 can be provided between the first and second membrane structures 114, 114-1, said at least one mechanical connection element being mechanically coupled between the first and second membrane structures 114, 114-1 and being mechanically decoupled from the counterelectrode structure 112. If the first and second membrane structures 114, 114-1 are configured in a hermetically sealed fashion, it is possible to form a cavity 116 between the first and second membrane structures 114, 114-1, in which cavity the counterelectrode structure 112 is situated, with an atmospheric reduced pressure.

Upon a deflection of the first and second membrane structures 114, 114-1, mechanically connected to one another, relative to the counterelectrode structure 112, said deflection can in turn be read out capacitively, for example, by the circuit device 120 in order to provide the output signal S1 dependent on the deflection $\Delta x$.

In accordance with one exemplary embodiment, the circuit device 120 is furthermore configured in the ultrasonic transmission operating state of the MEMS sound transducer 110 to apply an ultrasonic transmission signal $S_{TX}$ in the ultrasonic frequency range to at least one of the first and/or second membrane structure 114, 114-1 relative to the counterelectrode structure 112 of the MEMS sound transducer and in the ultrasonic reception operating state to detect an ultrasonic reception signal $S_{RX}$ of the MEMS sound transducer 110 on the basis of a deflection $\Delta x$ of the first and second membrane structures 114, 114-1 relative to the counterelectrode structure 112, said deflection being brought about by a reflected portion of the emitted ultrasonic transmission signal $S_{TX}$. The MEMS sound transducer 110 is furthermore configured such that the reflected portion of the emitted ultrasonic transmission signal $S_{TX}$ is obtained by a reflection of the emitted ultrasonic transmission signal $S_{TX}$ at an object (not shown in FIG. 2c) situated in the emission direction of the MEMS sound transducer 110.

As is illustrated in FIG. 2c, the MEMS sound transducer 110 thus comprises the further membrane structure 114-1, which is mechanically connected to the first membrane structure 114 by means of mechanical connection elements 115 in order to form a dual-membrane configuration (sealed dual-membrane configuration) of the MEMS sound transducer 110. In this case, the circuit device 120 is in turn configured in the first operating mode of the MEMS sound transducer 110 to detect in a "single-ended" (common-mode) or differential manner the mechanical deflection of the membrane structure 114 and of the further membrane structure 114-1 relative to the counterelectrode structure 112, said deflection being brought about by an acoustic sound pressure change.

In one exemplary embodiment, in the ultrasonic transmission operating state of the second operating mode of the MEMS sound transducer, the circuit device 120 then applies a DC voltage operating point to the membrane structure 114 with respect to the counterelectrode structure, wherein the circuit device furthermore applies an ultrasonic deflection signal to the further membrane structure 114-1 for generating the emitted ultrasonic transmission signal $S_{TX}$. In the ultrasonic reception operating state of the second operating mode of the MEMS sound transducer 110, the circuit device then detects an ultrasonic reception signal $S_{RX}$ of the MEMS sound transducer, which ultrasonic reception signal is based on the reflected signal portion of the emitted ultrasonic transmission signal $S_{TX}$ and brings about a deflection of the membrane structure and/or of the further membrane structure 114, 114-1 relative to the counterelectrode structure 112. In this case, the ultrasonic resonance range of the MEMS sound transducer is based on the ultrasonic resonance property of the further membrane structure 114-1.

In this context, it is furthermore pointed out that the excitation and the reading of the first and second membrane structures 114, 114-1 can of course also be correspondingly interchanged, i.e. the ultrasonic deflection signal can be applied to the first membrane structure 114 and the DC voltage operating point can be applied between the further membrane structure 114-1 and the counterelectrode structure 112. This is then correspondingly also applied to the reading out of the ultrasonic reception signal $S_{RX}$.

In accordance with a further exemplary embodiment, the circuit device 120 can furthermore be configured in the ultrasonic transmission operating state of the MEMS sound transducer 110 to apply an ultrasonic transmission signal $S_{TX}$ in the ultrasonic frequency range between the first and second membrane structures 114, 114-1 and the counterelectrode structure 112 of the MEMS sound transducer and in the ultrasonic reception operating state to detect an ultrasonic reception signal $S_{RX}$ of the MEMS sound transducer 110 on the basis of a deflection $\Delta x$ of the first and second membrane structures 114, 114-1 relative to the counterelectrode structure 112, said deflection being brought about by a reflected portion of the emitted ultrasonic transmission signal $S_{TX}$.

On account of the mechanical connection of the first and second membrane structures in the case of a MEMS microphone having a dual-membrane configuration, the total mass to be moved and the stiffness of the membrane arrangement to be excited in the ultrasonic frequency range, i.e. of the first and second membrane structures with the mechanical connection elements, may increase. An alteration of the resonance property or a shift in the resonant frequency, e.g. a reduction from e.g. 90 kHz to 60 kHz, of a MEMS microphone having a dual-membrane configuration vis-à-vis a MEMS microphone having a single membrane configuration can be set or compensated for within certain limits for example by layout measures, such as e.g. corrugations in the membrane structure, or else by technological parameters, e.g. by a doping of the semiconductor material of the membrane structure.

Figure 2D:
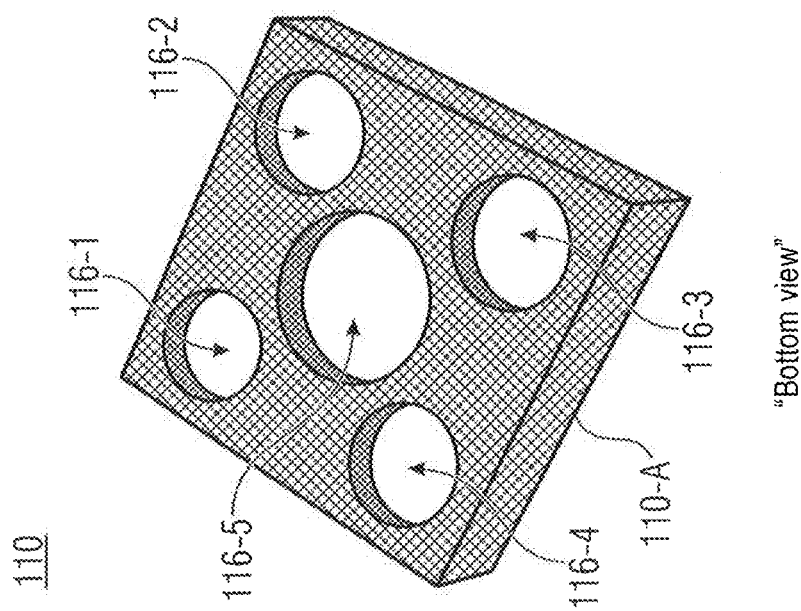
FIG. 2d shows a basic plan view and bottom view of an array of membrane-based MEMS microphones in accordance with one exemplary embodiment.
Figure 2D:
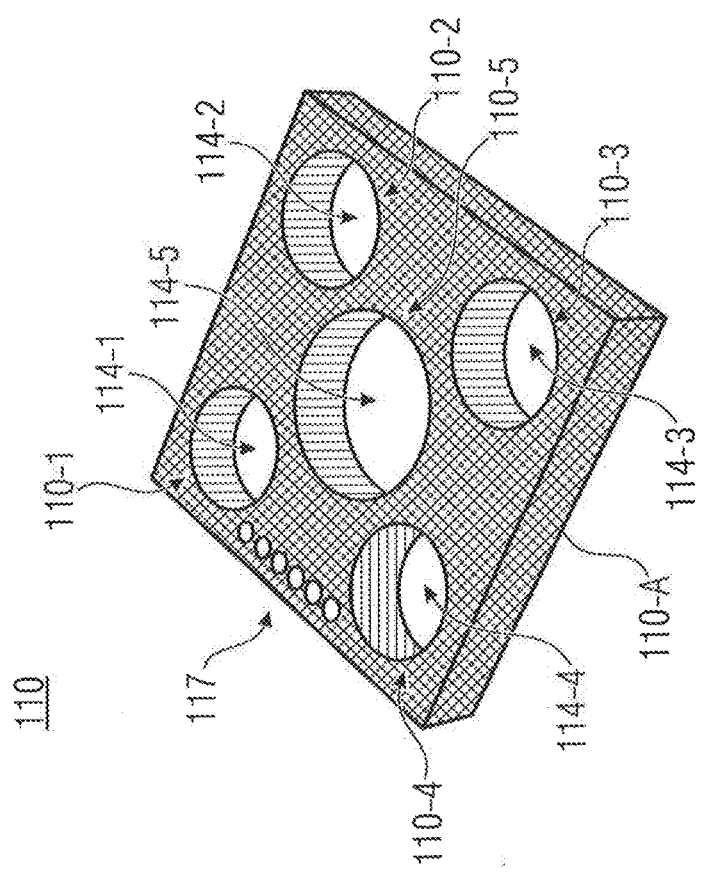

A basic plan view and bottom view of a sound transducer 110 comprising an array of membrane-based MEMS sound transducer elements or MEMS microphone elements 110-1 . . . 110-5 in accordance with a further exemplary embodiment will now be illustrated below with reference to FIG. 2d, said elements e.g. each comprising a membrane structure 114-1 . . . 114-5 and an assigned counterelectrode structure (not shown in FIG. 2d). In the case of the sound transducer array 110, a plurality of sound transducer elements 110-1 . . . 110-5 are arranged laterally alongside one another in a semiconductor substrate e.g. in the same plane. The sound transducer array 110 is thus situated on a single semiconductor or silicon chip (die) 110-A. That is to say that a plurality of individual sound transducer elements 110-1 ... 110-5, e.g. in a matrix, can be arranged in the same package 130. FIG. 2d illustrates by way of example only the membrane structures 114-1 ... 114-5 above the cavities 116-1 ... 116-5 (see the bottom view in FIG. 2d). A redistribution wiring and perforated counterelectrode(s) are not shown in FIG. 2d.

The number, shape and size of the individual sound transducer elements 110-1 ... 110-5 and also the associated redistribution wiring (not shown in FIG. 2d) are implementable in a flexible manner. Moreover, there is also the possibility of integrating a plurality of membrane structures 114-1 ... 114-5 on a cavity 116.

The distance between the sound transducer elements can correspond for example to half the sound wavelength, wherein an acceptable area utilization of the semiconductor chip can be achieved for ultrasonic frequencies at 100 kHz.

FIG. 2d illustrates by way of example five membrane structures 114-1 ... 114-5 on a chip 110-A in the illustration of the front side, wherein the illustrated arrangement and size should be regarded only as by way of example. Furthermore, there are six contacting pads 117, e.g. gold pads, of which for example five contacting pads are assigned individually and one contacting pad is assigned in a divided manner to the individual sound transducer elements 110-1 ... 110-5.

The rear side view in FIG. 2d shows e.g. different sized cavities 116-1 ... 116-5. In this regard, at least one or else a plurality (e.g. a group) of the MEMS sound transducer elements 110-1 ... 110-5 of the array can be configured differently than the rest of the MEMS sound transducer elements 110-1 ... 110-5 of the array, i.e. have for example a different size, a different diameter of the membrane structure, a different stiffness of the membrane structure, etc. In this regard, by way of example, the resonant frequency(-ies) $f_{RES}$ of the individual MEMS sound transducer elements or of the individual groups of MEMS sound transducer elements of the array can be influenced or else set in a targeted manner.

As is illustrated in FIG. 2d, each MEMS sound transducer element 110-1 ... 110-5 of the array can be assigned a dedicated cavity 116-1 ... 116-5 in the semiconductor chip 110-A. The cavities 116-1 ... 116-5 can be configured in an identical fashion or else differently e.g. in a manner corresponding to the configuration of the membrane structures 114-1 ... 114-5.

In accordance with one exemplary embodiment the MEMS sound transducer elements 110-1 ... 110-5 arranged in the semiconductor chip 110-A can also have a common cavity (not shown in FIG. 2d). In this regard, all or a portion of the MEMS sound transducer elements 110-1 ... 110-5 of the array can have a common cavity.

Such an array arrangement 110 enables e.g. so-called "beam forming" both in the transmission and in the reception operating state.

The MEMS sound transducer elements 110-1 ... 110-5 of the array can then be driven e.g. individually, jointly in a group or else altogether, wherein the description of the operating modes of the MEMS components 100 in the audio frequency range and in the ultrasonic frequency range is equally applicable to the array of MEMS sound transducer elements 110-1 ... 110-5 in FIG. 2d.

The circuit device 120 in FIGS. 2a-2d can firstly be configured, then, to determine, on the basis of a time duration $t_0$-$t_4$ between a transmission instant $t_0$ of the ultrasonic transmission signal $S_{TX}$ and an "assigned" ultrasonic reception instant $t_4$ of the ultrasonic reception signal $S_{RX}$ given a known or predefined ambient temperature $T_0$, information about the distance between the MEMS sound transducer 110 and the object (not shown in FIGS. 2a-2d) that brings about the reflection of the ultrasonic transmission signal $S_{TX}$. The circuit device 120 can thus furthermore be configured to provide an information signal $S_1$ that already has the information about the distance $X_0$ between the MEMS sound transducer 110 and the object that brings about the reflection of the ultrasonic transmission signal $S_{TX}$.

The circuit device 120 can furthermore be configured, then, to determine, on the basis of a time duration between a transmission instant $t_0$ of the ultrasonic transmission signal $S_{TX}$ and an assigned ultrasonic reception instant $t_4$ of the ultrasonic reception signal $T_{RX}$ given a known propagation distance or a known propagation path of the ultrasonic signal, information $S_1$ about an ambient temperature, e.g. of the surrounding fluid or of the ambient air situated between the MEMS sound transducer and the object that brings about the reflection of the ultrasonic transmission signal $S_{TX}$.

The physical relationships on the basis of which a reliable ambient temperature detection can be carried out with the present MEMS component 100 are discussed below. If a "reference distance" (or a reference path length) $X_{REF}$ is known for the propagation path of the emitted ultrasonic transmission signal, an additional ultrasonic measurement of the same distance (or path length) by way of the detection of the propagation time of the ultrasonic transmission signal $S_{TX}$ can make it possible to calculate the ambient temperature or air temperature $T_0$ since the velocity of sound in air depends principally on temperature and has only a small dependence e.g. on air pressure, air humidity and sound frequency.

The reference distance $X_{REF}$ can be realized for example by means of a predefined, specified distance between two MEMS sound transducers or ultrasonic transceivers 100 in accordance with the exemplary embodiments described. The reference distance $X_{REF}$ can be the known distance between two MEMS components 100 that are arranged or incorporated at a mobile device. The reference distance $X_{REF}$ can for example furthermore be determined precisely by means of radar detection or optical measurement etc. exactly as the distance to the object that "reflects" the ultrasonic transmission signal.

The present measurement principle that can be implemented with the MEMS components 100 in accordance with the exemplary embodiments described can thus be summarized as follows: a known or measured distance (path length) is determined by an independent non-temperature-sensitive procedure in order to obtain the reference distance $X_{REF}$. Along the same distance, a path measurement is carried out once again with the MEMS component 100 in accordance with exemplary embodiments by means of the transmitted ultrasonic transmission signal $S_{TX}$, wherein a reference temperature $T_{REF}$, e.g. $T_{REF}=0°$ C., is assumed. The distance measurement with the MEMS component 100 at the reference temperature $T_{REF}$ thus by definition yields the reference distance $X_{REF}$ as the result. If a difference between the instantaneously determined distance $X_0$ and the defined reference distance $X_{REF}$ then occurs during the distance measurement with the MEMS component 100, this difference is based on an ambient or air temperature that is different than the reference temperature $T_{REF}$. The difference between the instantaneously determined distance $X_0$ and the defined reference distance $X_{REF}$ is thus a measure of the instantaneous ambient temperature $T_0$, such that the instantaneous ambient temperature can be determined directly from the difference.

The detection of the ambient temperature $T_0$ by means of ultrasonic sensor elements which are realized with the MEMS components 100 in accordance with exemplary embodiments is implementable since the velocity $c_0$ of sound in an "ideal gas" is dependent only on the temperature and composition thereof. The velocity $c_0$ of sound in a gas mixture, such as e.g. customary ambient air, has a relatively weak dependence on the sound frequency and the air pressure, wherein the behavior of customary ambient air deviates only relatively little from the ideal behavior of an ideal gas.

Figure 3A:
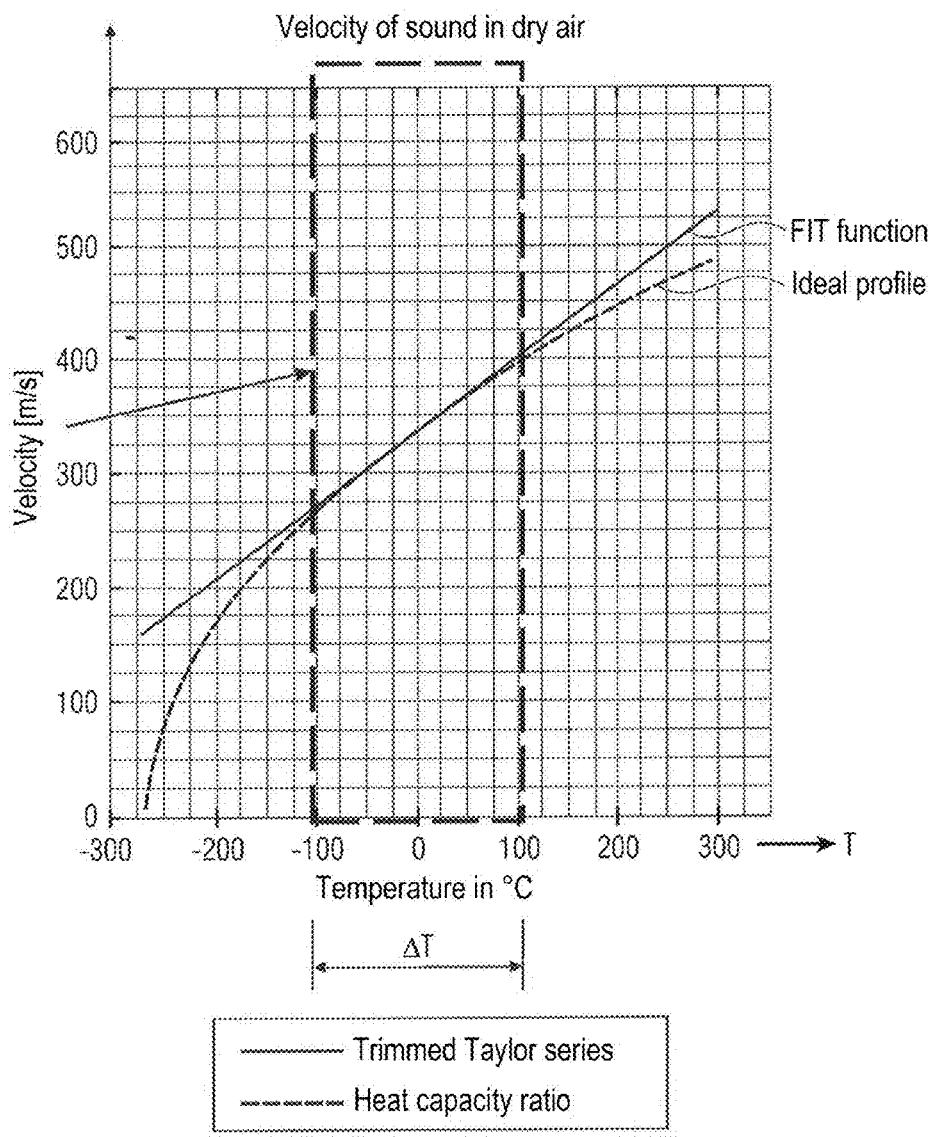
FIG. 3a shows a graphical illustration of the dependence of the velocity of sound in air on temperature.

In this context, reference is made to FIG. 3a, which has a graphical illustration of the dependence of the velocity of sound in "normal" ambient air on temperature. As can be gathered from the illustrated temperature window $\Delta T$ from $-100°$ C. to $+100°$ C., the subsequent FIT function can yield a sufficient correspondence to the expected temperature dependence (ideal profile) in the temperature window $\Delta T$. In this regard, in "dry air" (given an assumed air humidity of 0%) the approximate velocity of sound in ambient air in meters per second at temperatures around the zero point ($0°$ C.=the reference temperature $T_{REF}$) can be calculated as follows or be fitted using a fit function:

$$c_0 = (331.3 + 0.606 \cdot \vartheta) \text{ m/s},$$

wherein $\vartheta$ is the temperature in degrees Celsius (° C.).

Assuming a reference temperature $T_{REF}$ of e.g. $T_{REF}=0°$ C., upon a comparison with the reference distance $X_{REF}$, a propagation time difference $\Delta t$ of an ultrasonic pulse $S_{TX}$ on account of the temperature T in degrees Celsius (° C.) in air can be expected as follows:

$$\Delta t = \frac{N \times 0}{331.3 + 0.606T} - \frac{N \times 0}{c0}$$

wherein the factor N can assume for example the value 1 or 2.

Taking account of a series expansion (Taylor series) up to the second order, the following relationship between the propagation time difference $\Delta t$ and the temperature T may be obtained, for example:

$$\Delta t \approx -\frac{Na \times 0}{c0^2}T + \frac{Na^2 \times 0}{c0^3}T^2$$

wherein the factor N can assume for example the value 1 or 2.

With regard to the two relationships indicated above for the propagation time difference $\Delta t$, the factor N=1 is chosen if a direct propagation path between two MEMS sound transducers 110 is predefined. The factor N=2 should be chosen if a reflection (echo signal) of the emitted ultrasonic transmission signal or transmission pulse $S_{TX}$ at an object arranged at the predefined distance $X_0=X_{REF}$ is assumed, i.e. the path distance $X_0$ is covered twice.

For N=2, this results for example in a propagation time difference of the ultrasonic signal of approximately 11 $\mu s/(m° C.)$, which corresponds to a path length difference $\Delta x$ of 3.6 mm/(m° C.). For N=1, the above values for the propagation time difference and the path length difference are halved.

Figure 3B:
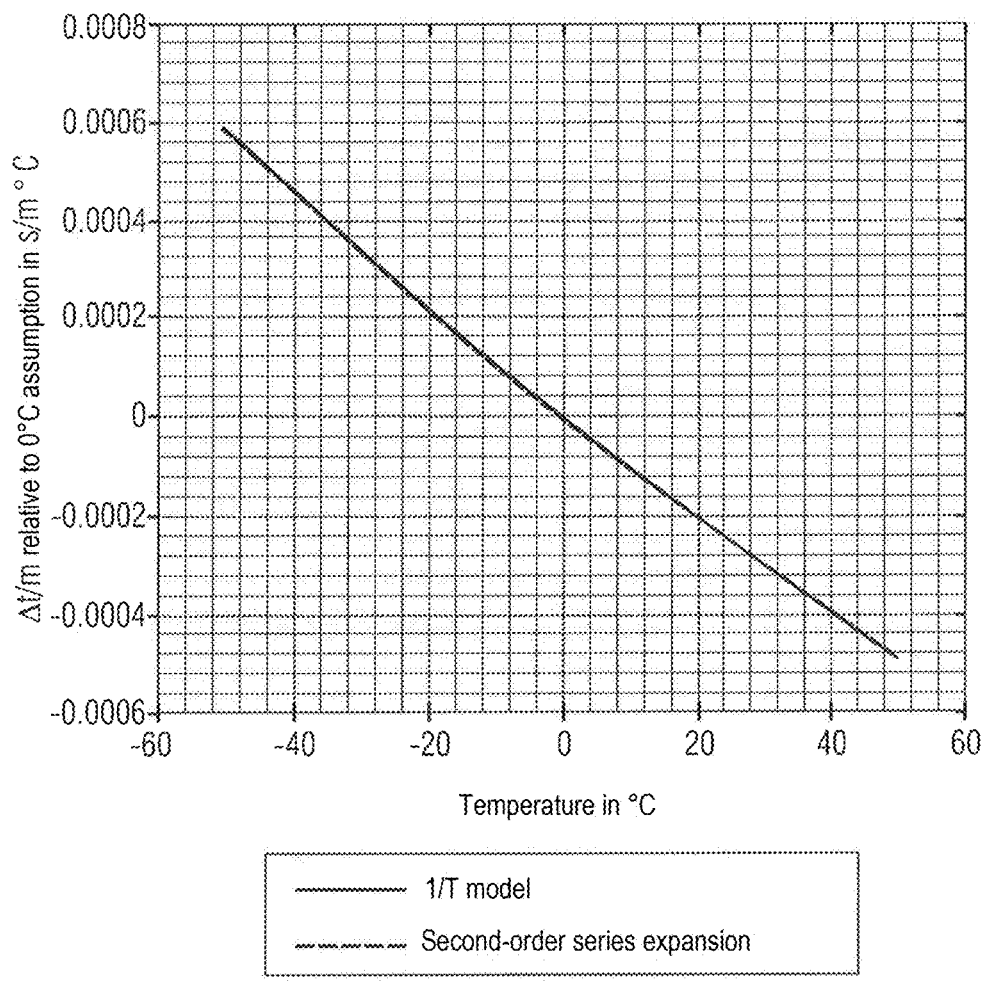
FIG. 3b shows a graphical illustration of the expected propagation time differences of an ultrasonic transmission signal as a function of the ambient temperature of the ambient medium, i.e. as a function of the ambient air temperature.

In this context, reference is made to the graphical illustration in FIG. 3b with the expected propagation time differences $\Delta t$ as a function of the ambient temperature $T_0$ given a predefined reference distance $X_0=X_{REF}$.

If, by way of example, two MEMS components 100 in accordance with exemplary embodiments are then arranged in a manner spaced apart at a defined, fixed distance $X_{REF}$ of e.g. 10 cm with respect to one another in a mobile device, e.g. a smartphone, this means a propagation time shift of the ultrasonic transmission signal or transmission pulse of approximately 0.5 $\mu s$ per $1°$ C., this corresponding approximately to the detected path length difference of 180 $\mu m$ per ° C. The propagation time shifts $\Delta t$ in this magnitude range are readily measurable and evaluatable with available clock frequencies of a mobile device of hundreds of MHz or else in the gigahertz range.

If, by way of example, a plurality of MEMS components 100 as ultrasonic transceivers are arranged at a known, fixed distance (reference distance $X_{REF}=x_0$) at an apparatus or a mobile device, for example, the distance measurement, i.e. the length comparison with the reference distance, can be carried out in all possible measurement directions predefined by the arrangement of the ultrasonic transceivers, in order to eliminate the influence of movement of the ambient atmosphere, i.e. air movements. The wind direction and wind velocity can thus be taken into account in the temperature measurement. In this regard, propagation time differences in the ultrasonic signal between opposite measurement directions may indicate air movement, such that air movement in the form of the wind direction and wind velocity can in turn be taken into account in the temperature determination by means of ultrasonic propagation time measurement.

Furthermore, after a determination of the ambient temperature or given the presence of the ambient temperature, it is possible to achieve a wind strength measurement and a wind direction measurement as an additional output signal in the case of such a sensor configuration comprising a plurality of ultrasonic transceiver elements corresponding to the MEMS components 100 in accordance with exemplary embodiments. Furthermore, cross-sensitivities on account of air humidity and air pressure can be further reduced or eliminated by virtue of corresponding measurement values from additional sensors, for example, being made available for the evaluation.

Figure 4:
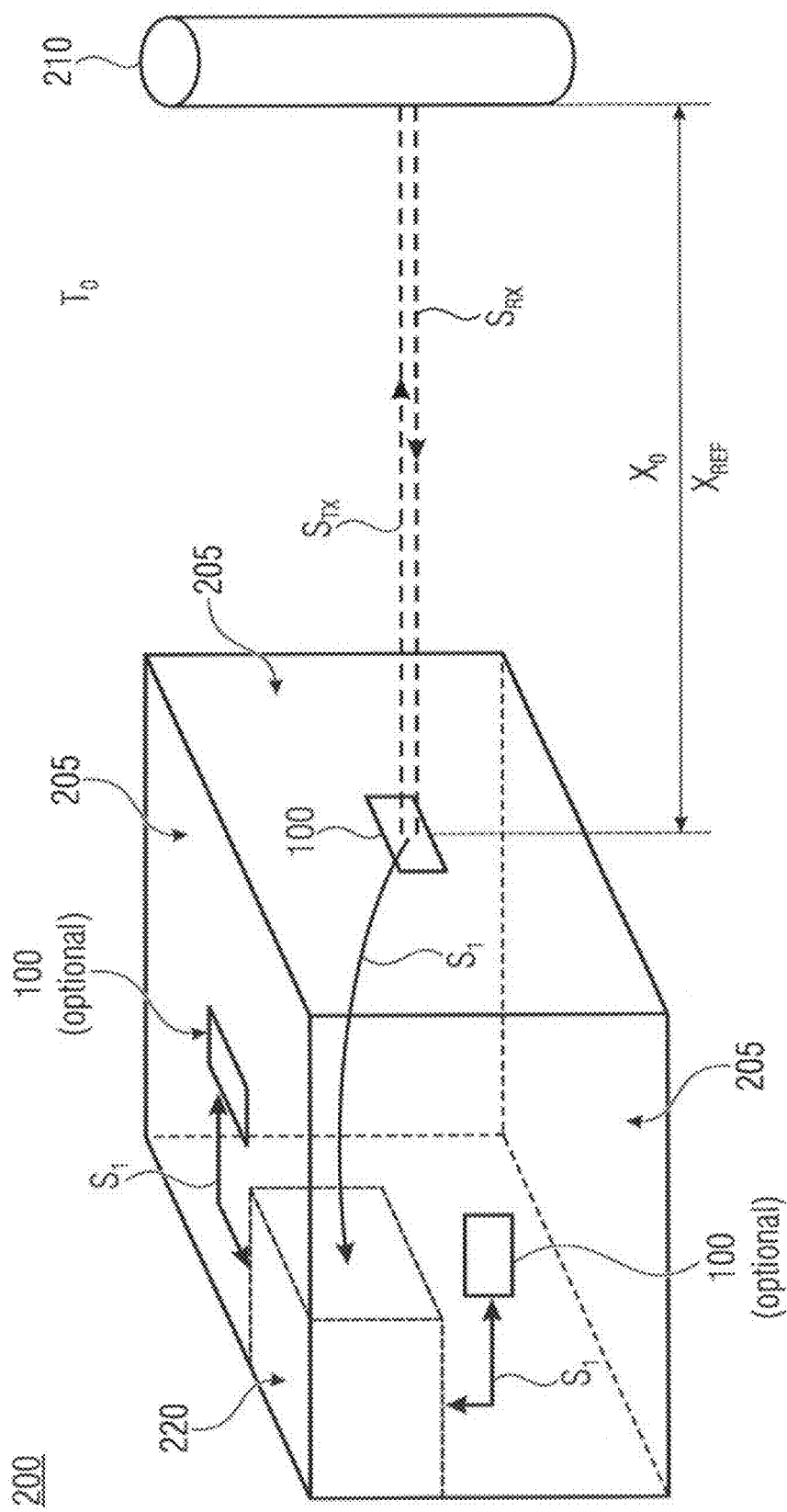
FIG. 4 shows a basic illustration of an apparatus comprising a MEMS component in accordance with one exemplary embodiment.

FIG. 4 then shows a basic illustration of an apparatus 200 comprising at least one MEMS component 100 in accordance with one exemplary embodiment. The MEMS component 100 is arranged as sensor at a predefined position at an outer side or a device frame 205 of the apparatus 200, wherein the circuit device 120 is furthermore configured to provide an information signal $S_1$ on the basis of a time duration $\Delta t$ between the transmission instant to of the ultrasonic transmission signal $S_{TX}$ and a reception instant $t_4$ of the assigned ultrasonic reception signal $S_{RX}$ (cf. FIG. 1c).

The information signal $S_1$, taking account of an ambient temperature $T_0$ that is known (within a tolerance range), for example, can comprise information about the distance $X_0$ between the MEMS component 100 or the MEMS sound transducer 110 thereof and the object 210 that brings about the reflection of the ultrasonic transmission signal $S_{TX}$. The information signal $S_1$, taking account of a propagation distance or propagation path $X_0=X_{REF}$ that is known (within a tolerance range) for the ultrasonic transmission signal, can furthermore comprise information about the ambient temperature $T_0$ between the MEMS component 100 and the object 210 that brings about the reflection of the ultrasonic transmission signal $S_{TX}$.

The circuit device 120 of the MEMS component 100 can furthermore be configured to forward the information signal $S_1$ to a processing device 220 of the apparatus, in order to determine a distance $X_0$ between the MEMS component 100 configured as a distance sensor and the object 210 that brings about the reflection of the ultrasonic transmission signal $S_{TX}$.

The apparatus 200 can thus be any desired device in which the MEMS component 100 can be implemented as a distance sensor and/or temperature sensor.

The apparatus 200 can furthermore optionally comprise a plurality of MEMS components 100 at different outer positions or at the frame 205 of the apparatus 200 as sensor elements for distance measurement and/or temperature measurement. In this regard, by way of example, it is also possible to arrange one or more MEMS components 100 per side surface or side surface region of the apparatus 200 in order to be effective as distance sensor(s) and/or temperature sensor(s). Furthermore, the MEMS components 100, on account of their small space requirement, can readily be arranged in an n×m array, where n≥2 and m≥2, at a side surface or a side surface region of the apparatus 200 in order, upon corresponding driving of the MEMS components 100, to obtain a directional effect or preferred direction or beam forming direction for the transmission and reception characteristics of the MEMS sound transducers 110 in the audio frequency range and/or in the ultrasonic frequency range or in order simply to increase the detection accuracy or sensitivity.

In the case where a multiplicity of MEMS components 100 are used, the respective circuit devices 120 can furthermore be configured to provide, for each MEMS component 100, on the basis of a time duration $\Delta t$ between the transmission instant $t_0$ of the ultrasonic transmission signal $S_{TX}$ and a reception instant $t_4$ of the ultrasonic reception signal $S_{RX}$, an information signal $S_1$ having information about the distance $x_0$ between the respective MEMS component 100 or the MEMS sound transducer 110 thereof and the object 210 that brings about the respective reflection of the ultrasonic transmission signal $S_{TX}$.

By virtue of the distributed arrangement of a plurality of MEMS components 100 as distance sensors, e.g. also in an array, at the device outer side or the device frame 205 of the apparatus 200, it is possible to carry out effective environment detection or environment monitoring or else object recognition in the environment of the apparatus 200.

Figure 5:
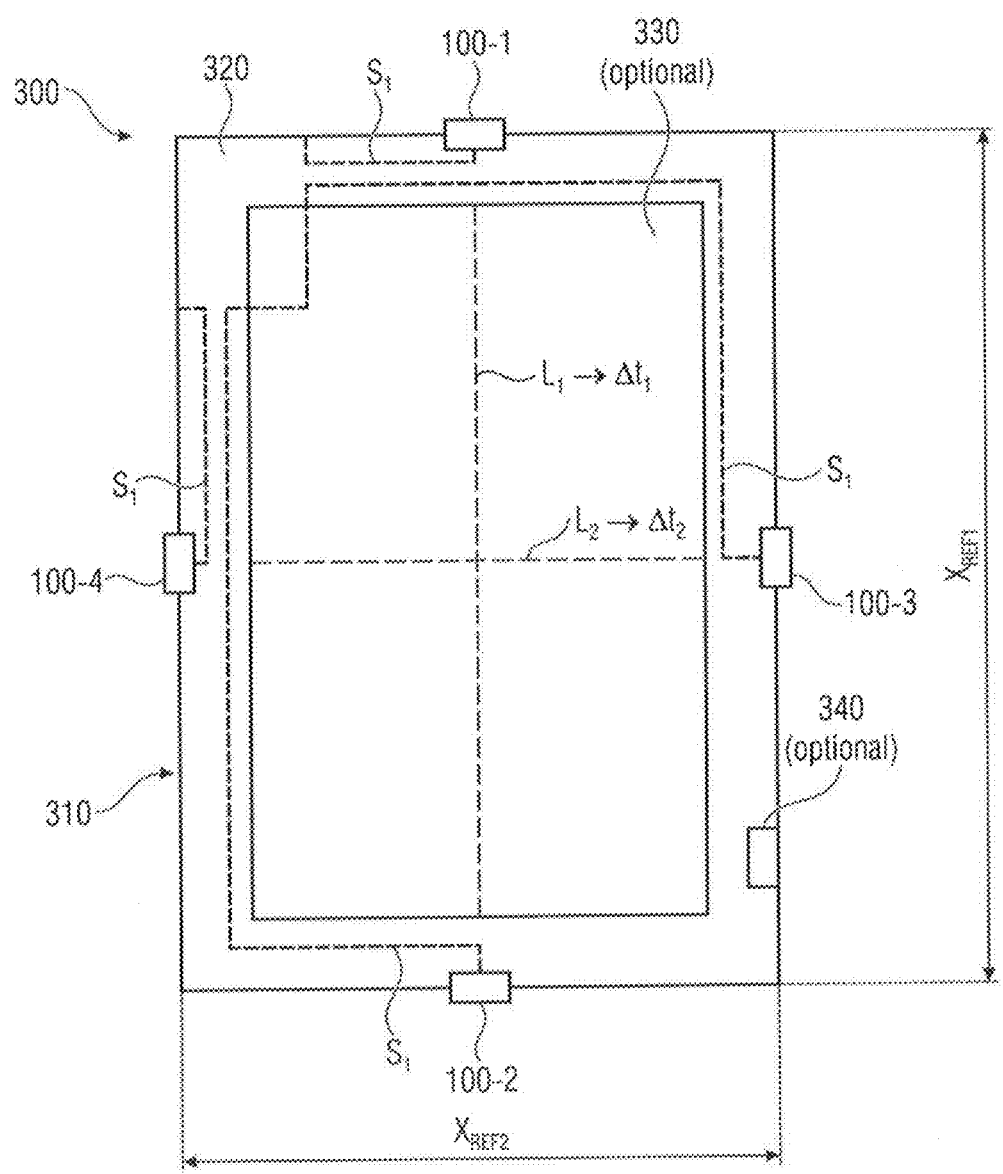
FIG. 5 shows a basic illustration of a mobile device comprising a MEMS component in accordance with one exemplary embodiment.

FIG. 5 illustrates a basic illustration in a plan view of a mobile, electronic device 300, such as e.g. a smartphone, notebook, tablet, laptop, smart watch, etc., comprising a plurality of MEMS components 100 (100-1, 100-2, 100-3, 100-4) in accordance with one exemplary embodiment. The acoustic MEMS components 100 are arranged at defined positions at a device frame 310 of the mobile device 300. The mobile device 300 can comprise a further processing device 320 for example, which is electrically and/or logically connected to the MEMS components 100 or the circuit devices 120 of the MEMS components 100. Furthermore, the mobile device can for example (optionally) comprise a display 330 for displaying and graphically representing information. The MEMS components 100 can be arranged in each case in pairs at a predefined distance $X_{REF1}$, $X_{REF2}$ with respect to one another at the device frame 310 of the mobile device 300.

As is illustrated by way of example in FIG. 5, two pairs of MEMS components 100 are arranged at the edge region 310 of the mobile device 300, wherein the first pair 100-1, 100-2 of MEMS components 100 are arranged at a distance $X_{REF1}$ from one another, and wherein the second pair 100-3, 100-4 of MEMS components 100 are arranged at a distance $X_{REF2}$ from one another. The two connecting lines $L_1$, $L_2$ between the two pairs of MEMS components 100 extend orthogonally to one another, wherein this should be assumed to be merely by way of example and can lead to facilitation of evaluation of the measurement results $S_1$. Furthermore, the processing device 320 can be configured to evaluate the ultrasonic reception signals or information signals $S_1$ obtained from the circuit devices 120 of the MEMS components.

The processing device 320 can furthermore be configured to evaluate the information signals $S_1$ provided by the circuit devices 120 of the MEMS components 100-1, . . . , 100-4.

The MEMS components 100-1, . . . ,100-4 of the mobile device 300 can be used for example in each case as individual sensors for distance measurement and temperature measurement. The respective MEMS component 100-1, . . . , 100-4 is arranged e.g. as sensor at a predefined position at an outer side or a device frame 310 of the mobile device 300, wherein the circuit device 120 is furthermore configured to provide an information signal $S_1$ on the basis of a time duration $\Delta t$ between the transmission instant to of the ultrasonic transmission signal $S_{TX}$ and a reception instant $t_4$ of the assigned ultrasonic reception signal $S_{RX}$ (cf. FIG. 1c).

The information signal $S_1$, taking account of an ambient temperature $T_0$ that is known (within a tolerance range), for example, can comprise information about the distance $X_0$ between the MEMS component 100 or the MEMS sound transducer 110 thereof and the object (not shown in FIG. 5) that brings about the reflection of the ultrasonic transmission signal $S_{TX}$. The information signal $S_1$, taking account of a propagation distance or propagation path $X_0=X_{REF}$ that is known (within a tolerance range) for the ultrasonic transmission signal, can furthermore comprise information about the ambient temperature $T_0$ between the MEMS component 100 and the object that brings about the reflection of the ultrasonic transmission signal $S_{TX}$.

The circuit device 120 of the MEMS component 100 can furthermore be configured to forward the information signal $S_1$ to a processing device 320 of the apparatus, in order to determine a distance $X_0$ between the MEMS component 100 configured as a distance sensor and the object that brings about the reflection of the ultrasonic transmission signal $S_{TX}$.

In accordance with a further exemplary embodiment, the processing device 320 can furthermore be configured to detect the information signals $S_1$ from the MEMS components 100 with regard to a first and a second propagation time $\Delta t_1$, $\Delta t_2$ of the emitted ultrasonic transmission signal through the ambient atmosphere between an assigned pair 100-1, 100-2 and 100-3, 100-4 of MEMS components 100 in a first and opposite second direction and to determine the ambient condition prevailing in the ambient atmosphere on the basis of the detected propagation times of the ultrasonic transmission signal between the assigned pair of MEMS components and the predefined distance $X_{REF1}$, $X_{REF2}$ of the assigned pair of MEMS components 100. By means of the measurement of the propagation time in different or opposite directions between an assigned pair 100-1, 100-2 and 100-3, 100-4 of MEMS components 100, it is possible, assuming a constant external temperature $T_0$ between the instants of the opposite measurements in the case of a propagation time difference between the two detected propagation times, to deduce air movement parallel to the connection line $L_1$, $L_2$ between the two assigned MEMS components. The magnitude of the propagation time difference between the oppositely emitted ultrasonic transmission signals $S_{TX}$ can then be assigned to a corresponding air movement or wind strength parallel to the connecting line between the assigned pair of MEMS components 100.

The processing device 320 can furthermore be configured, then, to evaluate a plurality of information signals $S_1$ from a plurality of pairs (e.g. N pairs) of MEMS components 100, to detect a plurality of propagation time pairs of the emitted ultrasonic transmission signals $S_{TX}$ through the ambient atmosphere between a plurality of assigned pairs of MEMS components 100 in different or opposite directions, and to determine direction information of the fluid movement, i.e. a wind direction, in the ambient atmosphere on the basis of the detected propagation time pairs of the ultrasonic transmission signals $S_{TX}$ between the assigned pairs of MEMS components 100 and the predefined distance $X_{REF-N}$ of the assigned N pairs of MEMS components 100.

The circuit unit 120 of the MEMS components can for example also be part of the processing device 320.

In the case of the mobile device 300, n pairs, where n≥2, of acoustic MEMS components 100 can thus be arranged at the device frame 310 of the mobile device 300 in each case at a predefined distance $X_{REF1}, X_{REF2} \ldots X_{REFn}$ with respect to one another and in a predefined position with respect to one another. The mobile device 300 can then furthermore optionally comprise an additional sensor element 340 for detecting an additional measurement variable, such as e.g. moisture and/or air pressure, in the ambient atmosphere, in order, for example, taking account of the additional measurement results with regard to the air humidity and/or the air pressure in the ambient atmosphere, to take account of corresponding cross-sensitivities in the calculation or determination of the distance information and/or the temperature information.

In accordance with one exemplary embodiment, the processing device 320 can be configured to take account of the determined relative movement velocity of the ambient atmosphere and/or the determined direction information of the movement velocity of the ambient atmosphere in the evaluation of the propagation time Δt of the emitted ultrasonic transmission signal $S_{TX}$ for determining the ambient temperature $T_0$ prevailing in the ambient atmosphere. If, by way of example, as described above, a plurality of MEMS components 100 as ultrasonic transceivers are arranged at a known, fixed distance (reference distance $X_{REF}=x_0$) at the mobile device 300, for example, the distance measurement, i.e. the length comparison with the reference distance, for temperature determination can be carried out in all possible measurement directions or connecting lines $L_1$, $L_2$ predefined by the arrangement of the ultrasonic transceivers 100-1 . . . 100-4, in order to eliminate the influence of movement of the ambient atmosphere, i.e. air movements. The wind direction and wind velocity can thus be taken into account in the temperature measurement. In this regard, propagation time differences in the ultrasonic signal between opposite measurement directions may indicate air movement, wherein this air movement can in turn be taken into account in the temperature determination by means of ultrasonic propagation time measurement.

With regard to the distance measurement described above, it is pointed out that the reference distance measurement or the reference distance value provided should be present with a greater accuracy than the accuracy of the acoustic ultrasonic measurement of the distance or the propagation time, in order to obtain sufficiently accurate measurement results. This is readily achieved by means of fixed transceiver elements, arranged at a known distance, in the form of the MEMS components 100 in accordance with the above exemplary embodiments in mobile devices 300.

Furthermore, it is pointed out that the coefficient of thermal expansion of solids, such as e.g. the materials of a mobile device, such as e.g. metal and/or plastics materials, is approximately a factor of "100" smaller than the change in the path length per degree Celsius that is detected by the ultrasonic measurement. Furthermore, since the temperature within the mobile device is generally known, these thermal expansion effects of the mobile device can be taken into account in the evaluation of measurement values. Furthermore, by way of example, an undesired lengthening of the sound path through a user's hand should readily be detected since the derived temperature can then be classified as unrealistically "cold".

While exemplary embodiments are suitable for various modifications and alternative forms, accordingly exemplary embodiments of same are shown by way of example in the figures and described thoroughly here. It goes without saying, however, that the intention is not to limit exemplary embodiments to the specific forms disclosed, rather on the contrary the exemplary embodiments are intended to cover all modifications, counterparts and alternatives that fall within the scope of the disclosure. Throughout the description of the figures, identical reference signs refer to identical or similar elements.

It goes without saying that if one element is designated as "connected" or "coupled" to another element, it can be connected or coupled directly to the other element or intermediate elements can be present. If, by contrast, one element is designated as "connected" or "coupled" directly to another element, no intermediate elements are present. Other expressions used for describing the relationship between elements should be interpreted in a similar way (e.g. "between" vis-à-vis "directly between", "adjacent" vis-à-vis "directly adjacent", etc.).

It furthermore goes without saying that if one element is designated as "arranged at, on, above, alongside, below or beneath another element", this element can be arranged directly at, on, above, alongside, below or beneath the other element or one or more intermediate elements can be present. If, in contrast thereto, one element is designated as arranged "directly" at, on, above, alongside, below or beneath another element, no intermediate elements are present. Furthermore, it is pointed out that the terms used "above or vertically above, alongside, below, beneath, laterally and vertically with respect to" refer to the relative arrangement of different elements with respect to one another in relation to the respectively illustrated plane of the drawing in the different figures and should be understood in accordance with the respective illustration.

Furthermore, the formulation "at least one" element should be understood to mean that one element or a plurality of elements can be provided.

The terminology used here is intended only to describe specific exemplary embodiments and is not intended to have a limiting effect for exemplary embodiments. According to usage herein, the singular forms "a, an" and "the" are also intended to encompass the plural forms, unless clearly indicated otherwise in the context. It furthermore goes without saying that the terms "comprises", "comprising", "have" and/or "having" in the usage herein indicate the presence of indicated features, integers, steps, operations, elements and/or constituents but do not exclude the presence or addition of one or more other features, integers, steps, operations, elements, constituents and/or groups thereof.

Unless defined otherwise, all terms used here (including technical and scientific terms) have the same meaning as is normally understood by a person of average skill in the art in the field to which exemplary embodiments belong. Furthermore, it goes without saying that terms, e.g. those defined in dictionaries normally used, should be interpreted as having a meaning which corresponds to their meaning in the context of the corresponding technical area. However, if the present disclosure gives a term a specific meaning that deviates from a meaning such as is normally understood by a person of average skill in the art, said meaning should be taken into account in the specific context in which this definition is given.

In the description below, the description of an element composed of a semiconductor material means that the element comprises a semiconductor material, i.e. is formed at least partly or else completely from the semiconductor material.

Although some aspects have been described in association with a MEMS component, an apparatus comprising at least one MEMS component and a mobile device comprising a plurality of MEMS components, it goes without saying that these aspects also constitute a description of the corresponding method for determining measurement values, such that a block or a component of a corresponding apparatus should also be understood as a method step or a feature of a method step of a corresponding method. Some or all of the method steps can be carried out by a hardware apparatus (or using a hardware apparatus), such as using a microprocessor, a programmable computer or an electronic circuit. In some exemplary embodiments, some or a plurality of the most important method steps can be carried out by such an apparatus.

In the detailed description above, in some instances different features have been grouped together in examples in order to rationalize the disclosure. This type of disclosure ought not be interpreted as the intention that the claimed examples have more features than are expressly indicated in each claim. Rather, as represented by the following claims, the subject matter can reside in fewer than all features of an individual example disclosed. Consequently, the claims that follow are hereby incorporated in the detailed description, wherein each claim can be representative of a dedicated separate example. While each claim can be representative of a dedicated separate example, it should be noted that although dependent claims refer back in the claims to a specific combination with one or more other claims, other examples also comprise a combination of dependent claims with the subject matter of any other dependent claim or a combination of each feature with other dependent of independent claims. Such combinations shall be encompassed, unless an explanation is given that a specific combination is not intended. Furthermore, the intention is for a combination of features of a claim with any other independent claim also to be encompassed, even if this claim is not directly dependent on the independent claim.

Although specific exemplary embodiments have been illustrated and described herein, it will be evident to a person skilled in the art that a multiplicity of alternative and/or equivalent implementations can be substituted for the specific exemplary embodiments shown and illustrated therein, without departing from the subject matter of the present application. This application text is intended to cover all adaptations and variations of the specific exemplary embodiments described and discussed herein. Therefore, the present subject matter of the application is limited only by the wording of the claims and the equivalent embodiments thereof.

What is claimed is:

1. A mobile device comprising:
a plurality of MEMS components, wherein the plurality of MEMS components are arranged at predefined positions at a device frame of the mobile device,
wherein the plurality of MEMS components are arranged in pairs at a predefined distance with respect to one another at the device frame of the mobile device,
wherein a first MEMS component of a first MEMS component pair is arranged at a first device frame edge and a second MEMS component of the first MEMS component pair is arranged at a second device frame edge, the arrangement of the first MEMS component and the second MEMS component defining a first line,
wherein a third MEMS component of a second MEMS component pair is arranged at a third device frame edge and a fourth MEMS component of the second MEMS component pair is arranged at a fourth device frame edge, the arrangement of the third MEMS component and the fourth MEMS component defining a second line orthogonal to the first line, and
wherein each MEMS component comprises a MEMS sound transducer having a membrane structure and an assigned counterelectrode structure, and is in communication with a circuit unit, which is electrically coupled to the MEMS sound transducer and which is furthermore configured in a first operating mode of the MEMS sound transducer in an audio frequency range to detect an audio output signal of the MEMS sound transducer on the basis of a deflection of the membrane structure relative to the counterelectrode structure, said deflection being brought about by an acoustic sound pressure change, and in a second operating mode of the MEMS sound transducer in an ultrasonic frequency range furthermore to drive and read the MEMS sound transducer as an ultrasonic transceiver.

2. The mobile device as claimed in claim 1, wherein the second operating mode of the MEMS sound transducer comprises an ultrasonic transmission operating state and an ultrasonic reception operating state, wherein the circuit unit is furthermore configured to drive the MEMS sound transducer as an ultrasonic transmitter in an ultrasonic transmission operating state, and to read the ultrasonic sound transducer as ultrasonic receiver in an ultrasonic reception operating state.

3. The mobile device as claimed in claim 2, wherein the circuit unit is furthermore configured in the ultrasonic transmission operating state of the MEMS sound transducer to excite an ultrasonic transmission signal in the ultrasonic frequency range at the membrane structure or counterelectrode structure of the MEMS sound transducer and in the ultrasonic reception operating state to detect an ultrasonic reception signal of the MEMS sound transducer on the basis of a deflection between the membrane structure and the counterelectrode structure, said deflection being brought about by a reflected portion of an emitted ultrasonic transmission signal.

4. The mobile device as claimed in claim 3, wherein the MEMS sound transducer is configured such that the reflected portion of the emitted ultrasonic transmission signal is obtained by a reflection of the emitted ultrasonic transmission signal at an object situated in an emission direction of the MEMS sound transducer.

5. The mobile device as claimed in claim 1, wherein the circuit unit is furthermore configured to drive and/or read the MEMS sound transducer in the second operating mode in an ultrasonic resonance range of the MEMS sound transducer.

6. The mobile device as claimed in claim 5, wherein the ultrasonic resonance range of the MEMS sound transducer is based on an ultrasonic resonance property of a component part of the sound transducer.

7. The mobile device as claimed in claim 1, wherein the MEMS sound transducer has an ultrasonic resonant frequency in a range of between 20 and 150 kHz or between 20 and 120 kHz.

8. The mobile device as claimed in claim 1, wherein the MEMS sound transducer comprises a further counterelectrode structure and is configured in a dual-counterelectrode configuration, wherein the circuit unit is furthermore configured
- in the first operating mode of the MEMS sound transducer to detect the deflection of the membrane structure relative to the counterelectrode structure and/or the further counterelectrode structure, said deflection being brought about by an acoustic sound pressure change,
- in an ultrasonic transmission operating state of the second operating mode of the MEMS sound transducer to set an ultrasonic excitation signal between the membrane structure and at least one of the assigned counterelectrode structure or the further counterelectrode structure for generating an ultrasonic transmission signal and
- in an ultrasonic reception operating state of the second operating mode of the MEMS sound transducer to read out an ultrasonic reception signal of the MEMS sound transducer, which ultrasonic reception signal is based on a reflected signal portion of an emitted ultrasonic transmission signal and brings about a deflection between the membrane structure and the counterelectrode structure and/or the further counterelectrode structure.

9. The mobile device as claimed in claim 1, wherein the MEMS sound transducer comprises a further membrane structure, which is mechanically connected to the membrane structure by means of a mechanical connection element and is configured in a dual-membrane configuration, wherein the circuit unit is furthermore configured
- in the first operating mode of the MEMS sound transducer to detect a common deflection of the membrane structure and of the further membrane structure relative to the counterelectrode structure, said deflection being brought about by an acoustic sound pressure change,
- in an ultrasonic transmission operating state of the second operating mode of the MEMS sound transducer to apply an ultrasonic excitation signal to at least one of the membrane structure and of the further membrane structure with respect to the counterelectrode structure for generating an emitted ultrasonic transmission signal and
- in an ultrasonic reception operating state of the second operating mode of the MEMS sound transducer to detect an ultrasonic reception signal of the MEMS sound transducer, which ultrasonic reception signal is based on a reflected signal portion of the emitted ultrasonic transmission signal and brings about a deflection of the membrane structure and/or the further membrane structure relative to the counterelectrode structure.

10. The mobile device as claimed in claim 1, wherein the circuit unit is furthermore configured to determine, on the basis of a time duration between a transmission instant of an ultrasonic transmission signal and a reception instant of the ultrasonic reception signal, information about the distance between the MEMS sound transducer and an object that brings about a reflection of the ultrasonic transmission signal.

11. The mobile device as claimed in claim 1, wherein the circuit unit is furthermore configured to determine information about an ambient temperature on the basis of a time duration between a transmission instant of an ultrasonic transmission signal and a reception instant of an assigned ultrasonic reception signal.

12. The mobile device as claimed in claim 1, wherein the circuit unit is furthermore configured at least in an ultrasonic reception operating state to apply a pull-in signal to the membrane structure in order to bring the membrane structure to a mechanical damping state.

13. The mobile device as claimed in claim 12, wherein the pull-in signal brings about a change in a resonant frequency of the sound transducer in an ultrasonic reception mode for the ultrasonic signal.

14. The mobile device as claimed in claim 1, wherein the circuit unit furthermore comprises an array of membrane-based MEMS sound transducer elements comprising a membrane structure and an assigned counterelectrode structure.

15. The mobile device as claimed in claim 1,
wherein the at least one of the plurality of MEMS components is arranged as sensor at an outer position of the mobile device, wherein the circuit unit is furthermore configured to provide an information signal on the basis of a time duration between a transmission instant of an ultrasonic transmission signal and a reception instant of the ultrasonic reception signal.

16. The mobile device as claimed in claim 15, wherein the information signal comprises information about a distance between the MEMS component and an object that brings about a reflection of the ultrasonic transmission signal, or wherein the information signal comprises information about an ambient temperature in an ambient atmosphere between the MEMS component and the object that brings about the reflection of the ultrasonic transmission signal.

17. The mobile device as claimed in claim 15, wherein the mobile device furthermore comprises a processing device, wherein the circuit unit is furthermore configured to forward the information signal to the processing device, wherein the processing device is configured
- to determine, on the basis of the information signal and a known ambient temperature, a distance between the MEMS component and an object that brings about a reflection of the ultrasonic transmission signal or
- to determine an ambient temperature on the basis of a known distance between the MEMS component and the object that brings about the reflection of the ultrasonic transmission signal.

18. The mobile device as claimed in claim 15, wherein the mobile device comprises a plurality of MEMS components arranged as distance sensors and/or temperature sensors at distributed outer positions of the mobile device, wherein a processing device is configured to evaluate the information signals of the MEMS components with distance information in order to carry out a spatial detection of the surroundings of the mobile device.

19. The mobile device as claimed in claim 1, wherein an information signal provided by the circuit unit comprises information about a distance between the MEMS component and an object that brings about a reflection of an ultrasonic transmission signal, or wherein the information signal comprises information about an ambient temperature in an ambient atmosphere between the MEMS component and the object that brings about the reflection of the ultrasonic transmission signal.

20. The mobile device as claimed in claim 1, wherein the mobile device furthermore comprises a processing device, wherein the processing device is configured to evaluate information signals of the MEMS components.

21. The mobile device as claimed in claim 20, wherein the processing device is furthermore configured to detect a propagation time of an emitted ultrasonic transmission signal through an ambient atmosphere between an assigned pair of acoustic MEMS components and to determine an ambient temperature prevailing in an ambient atmosphere on the basis of the detected propagation time of an ultrasonic transmission signal between the assigned pair of acoustic MEMS components and a predefined distance between the assigned pair of MEMS components.

22. The mobile device as claimed in claim 20, wherein the processing device is configured to detect a first and a second propagation time of an emitted ultrasonic transmission signal through an ambient atmosphere between an assigned pair of acoustic MEMS components in opposite directions and to determine relative movement velocity of the ambient atmosphere on the basis of the detected propagation times of the ultrasonic transmission signal between the assigned pair of acoustic MEMS components and a predefined distance between the assigned pair of MEMS components.

23. The mobile device as claimed in claim 22, wherein the processing device is configured to take account of the determined relative movement velocity of the ambient atmosphere and/or determined direction information of movement velocity of the ambient atmosphere in the evaluation of the propagation time of the emitted ultrasonic transmission signal for determining an ambient temperature prevailing in the ambient atmosphere.

24. The mobile device as claimed in claim 20, wherein the processing device is configured to detect a plurality of propagation times of an emitted ultrasonic transmission signal through an ambient atmosphere between a plurality of assigned pairs of acoustic MEMS components and to determine direction information of movement velocity of the ambient atmosphere on the basis of the detected propagation times of the ultrasonic transmission signals between the assigned pairs of acoustic MEMS components and a predefined distance between the assigned pairs of MEMS components.

* * * * *